US012321822B2

(12) United States Patent
Martinis et al.

(10) Patent No.: US 12,321,822 B2
(45) Date of Patent: Jun. 3, 2025

(54) QUANTUM COMPUTING SYSTEM HAVING FLEX CIRCUIT BOARDS FOR IMPROVED SIGNAL TRANSMISSIONS

(71) Applicant: Google LLC, Mountain View, CA (US)

(72) Inventors: John Martinis, Santa Barbara, CA (US); Bob Benjamin Buckley, Santa Barbara, CA (US); Xiaojun Trent Huang, Santa Barbara, CA (US)

(73) Assignee: GOOGLE LLC, Mountain View, CA (US)

( * ) Notice: Subject to any disclaimer, the term of this patent is extended or adjusted under 35 U.S.C. 154(b) by 778 days.

(21) Appl. No.: 17/476,655

(22) Filed: Sep. 16, 2021

(65) Prior Publication Data
US 2022/0083893 A1    Mar. 17, 2022

Related U.S. Application Data

(60) Provisional application No. 63/079,256, filed on Sep. 16, 2020.

(51) Int. Cl.
*H05K 1/18* (2006.01)
*G06N 10/00* (2022.01)
(Continued)

(52) U.S. Cl.
CPC ............. *G06N 10/00* (2019.01); *G06N 10/40* (2022.01); *H01R 12/78* (2013.01); *H01R 12/79* (2013.01);
(Continued)

(58) Field of Classification Search
CPC ...... G06N 10/00; G06N 10/40; H05K 1/0277; H05K 1/189; H05K 1/142; H05K 1/147;
(Continued)

(56) References Cited

U.S. PATENT DOCUMENTS 6,930,240 B1 *  8/2005  Giboney ............... H05K 3/361
                                                    439/497
2010/0157552 A1   6/2010  Thom et al.
(Continued)

FOREIGN PATENT DOCUMENTS

JP    H05299708 A    11/1993
JP    H05304224 A    11/1993
(Continued)

OTHER PUBLICATIONS

International Search Report and Written Opinion for Application No. PCT/US2021/050626, mailed Dec. 23, 2021, 15 pages.
(Continued)

*Primary Examiner* — Roshn K Varghese
(74) *Attorney, Agent, or Firm* — DORITY & MANNING P.A.

(57) ABSTRACT

A quantum computing system can include one or more classical processors. The quantum computing system can include quantum hardware including one or more qubits. The quantum computing system can include a chamber mount configured to support the quantum hardware. The quantum computing system can include a vacuum chamber configured to receive the chamber mount and dispose the quantum hardware in a vacuum. The vacuum chamber can form a cooling gradient from an end of the vacuum chamber to the quantum hardware. The quantum computing system can include a plurality of flex circuit boards including one or more signal lines. Each of the plurality of flex circuit boards can be configured to transmit signals by the one or more signal lines through the vacuum chamber to couple the one or more classical processors to the quantum hardware.

20 Claims, 12 Drawing Sheets

(51) Int. Cl.
*G06N 10/40* (2022.01)
*H01R 12/78* (2011.01)
*H01R 12/79* (2011.01)
*H05K 1/02* (2006.01)
*H05K 7/20* (2006.01)

(52) U.S. Cl.
CPC ........... *H05K 1/0277* (2013.01); *H05K 1/189* (2013.01); *H05K 7/2039* (2013.01)

(58) Field of Classification Search
CPC .... H05K 1/0225; H05K 1/0393; H05K 1/117; H05K 1/0221; H05K 2201/058; H05K 2201/09063; H05K 2201/2009; H05K 2201/0154; H05K 2201/09327; H01R 12/78; H01R 12/79; H10N 69/00
See application file for complete search history.

(56) References Cited

U.S. PATENT DOCUMENTS

| | | | |
|---|---|---|---|
| 2017/0019997 A1* | 1/2017 | Boudreaux | H05K 3/366 |
| 2018/0294401 A1 | 10/2018 | Tuckerman | |
| 2019/0027800 A1* | 1/2019 | El Bouayadi | H05K 1/0203 |
| 2019/0341173 A1 | 10/2019 | Smith et al. | |
| 2020/0100357 A1* | 3/2020 | Olivadese | H05K 1/0243 |
| 2020/0272927 A1* | 8/2020 | Bronn | G06N 10/00 |

FOREIGN PATENT DOCUMENTS

| | | |
|---|---|---|
| JP | H06523621 A | 2/1994 |
| WO | WO 2018/213494 | 11/2018 |
| WO | WO 2019/050525 | 3/2019 |

OTHER PUBLICATIONS

Deshpande et al., "Integrating High-Density Microwave Signalling and Packaging With Superconducting Qubits", 2019 IEEE/MTT-S International Microwave Symposium—IMS, Jun. 2, 2019, Boston, Massachusetts, pp. 271-274.

Shubin et al., "Novel Packaging with Rematable Spring Interconnect Chips for MCM", 59th Electronic Components and Technology Conference, May 26-29, 2009, San Diego, California, 7 pages.

Chow et al., "Pressure Contact Micro-Springs in Small Pitch Flip-Chip Packages", IEEE Transactions on Components and Packaging Technologies, vol. 29, No. 4, pp. 796-803.

Laird.com, "Flexible Foam Sheet Broadband Microwave Absorber", https://www.laird.com/sites/default/files/2021-01/RFP-DS-AN%2006242020.pdf, retrieved on Jan. 19, 2022, 2 pages.

International Preliminary Report on Patentability for Application No. PCT/US2021/050626, mailed Mar. 30, 2023, 9 pages.

* cited by examiner

QUANTUM COMPUTING SYSTEM HAVING FLEX CIRCUIT BOARDS FOR IMPROVED SIGNAL TRANSMISSIONS

PRIORITY CLAIM

The present application claims the benefit of priority of U.S. Provisional Application Ser. No. 63/079,256, filed on Sep. 16, 2020, titled Quantum Computing System having Flex Circuit Boards for Improved Signal Transmissions, which is incorporated herein by reference.

FIELD

The present disclosure relates generally to quantum computing systems, and, more particularly, to improved signal transmissions for quantum computing systems.

BACKGROUND

Quantum computing is a computing method that takes advantage of quantum effects, such as superposition of basis states and entanglement to perform certain computations more efficiently than a classical digital computer. In contrast to a digital computer, which stores and manipulates information in the form of bits, e.g., a "1" or "0," quantum computing systems can manipulate information using quantum bits ("qubits"). A qubit can refer to a quantum device that enables the superposition of multiple states, e.g., data in both the "0" and "1" state, and/or to the superposition of data, itself, in the multiple states. In accordance with conventional terminology, the superposition of a "0" and "1" state in a quantum system may be represented, e.g., as a $|0\rangle + b|1\rangle$ The "0" and "1" states of a digital computer are analogous to the $|0\rangle$ and $|1\rangle$ basis states, respectively of a qubit.

SUMMARY

Aspects and advantages of embodiments of the present disclosure will be set forth in part in the following description, or can be learned from the description, or can be learned through practice of the embodiments.

One example aspect of the present disclosure is directed to a quantum computing system. The quantum computing system can include one or more classical processors. The quantum computing system can include quantum hardware including one or more qubits. The quantum computing system can include a chamber mount configured to support the quantum hardware. The quantum computing system can include a vacuum chamber configured to receive the chamber mount and dispose the quantum hardware in a vacuum. The vacuum chamber can form a cooling gradient from an end of the vacuum chamber to the quantum hardware. The quantum computing system can include a plurality of flex circuit boards including one or more signal lines. Each of the plurality of flex circuit boards can be configured to transmit signals by the one or more signal lines through the vacuum chamber to couple the one or more classical processors to the quantum hardware.

Another example aspect of the present disclosure is directed to a method of operating a quantum computing system including flex circuit boards. The method can include transmitting, by one or more classical processors, a control pulse to one or more signal lines. The one or more signal lines can be disposed in one or more flex circuit boards. The method can include transmitting, by the one or more signal lines, the control pulse through the one or more flex circuit boards to one or more quantum computing devices. The method can include applying, by the one or more quantum computing devices, the control pulse to implement at least one quantum operation based at least in part on the control pulse.

Another example aspect of the present disclosure is directed to a quantum computing system. The quantum computing system can include one or more classical processors. The quantum computing system can include quantum hardware including one or more qubits. The quantum computing system can include a chamber mount configured to support the quantum hardware. The quantum computing system can include a vacuum chamber configured to receive the chamber mount and dispose the quantum hardware in a vacuum. The vacuum chamber can form a cooling gradient from an end of the vacuum chamber to the quantum hardware. The quantum computing system can include at least one first flex circuit board coupled to the one or more classical processors by a classical-flex interconnect. The at least one first flex circuit board can include copper. The quantum computing system can include at least one second flex circuit board coupled to the at least one first flex circuit board by a first flex-flex interconnect. The at least one second flex circuit board can include a copper alloy. The quantum computing system can include at least one surface mount attenuator board including one or more surface mount attenuators coupled to the at least one second flex circuit board. The at least one surface mount attenuator board can include copper. The quantum computing system can include at least one third flex circuit board coupled to the at least one surface mount attenuator board by a second flex-flex interconnect. The at least one third flex circuit board can include niobium. The quantum computing system can include at least one fourth flex circuit board coupled to the at least one third flex circuit board by a third flex-flex interconnect. The at least one fourth flex circuit board can include copper. The quantum computing system can include a connector configured to couple the at least one fourth flex circuit board to the quantum hardware.

Other aspects of the present disclosure are directed to various systems, apparatuses, non-transitory computer-readable media, user interfaces, and electronic devices.

These and other features, aspects, and advantages of various embodiments of the present disclosure will become better understood with reference to the following description and appended claims. The accompanying drawings, which are incorporated in and constitute a part of this specification, illustrate example embodiments of the present disclosure and, together with the description, serve to explain the related principles.

BRIEF DESCRIPTION OF THE DRAWINGS

Detailed discussion of embodiments directed to one of ordinary skill in the art is set forth in the specification, which refers to the appended figures, in which.

DETAILED DESCRIPTION

Figure 1:
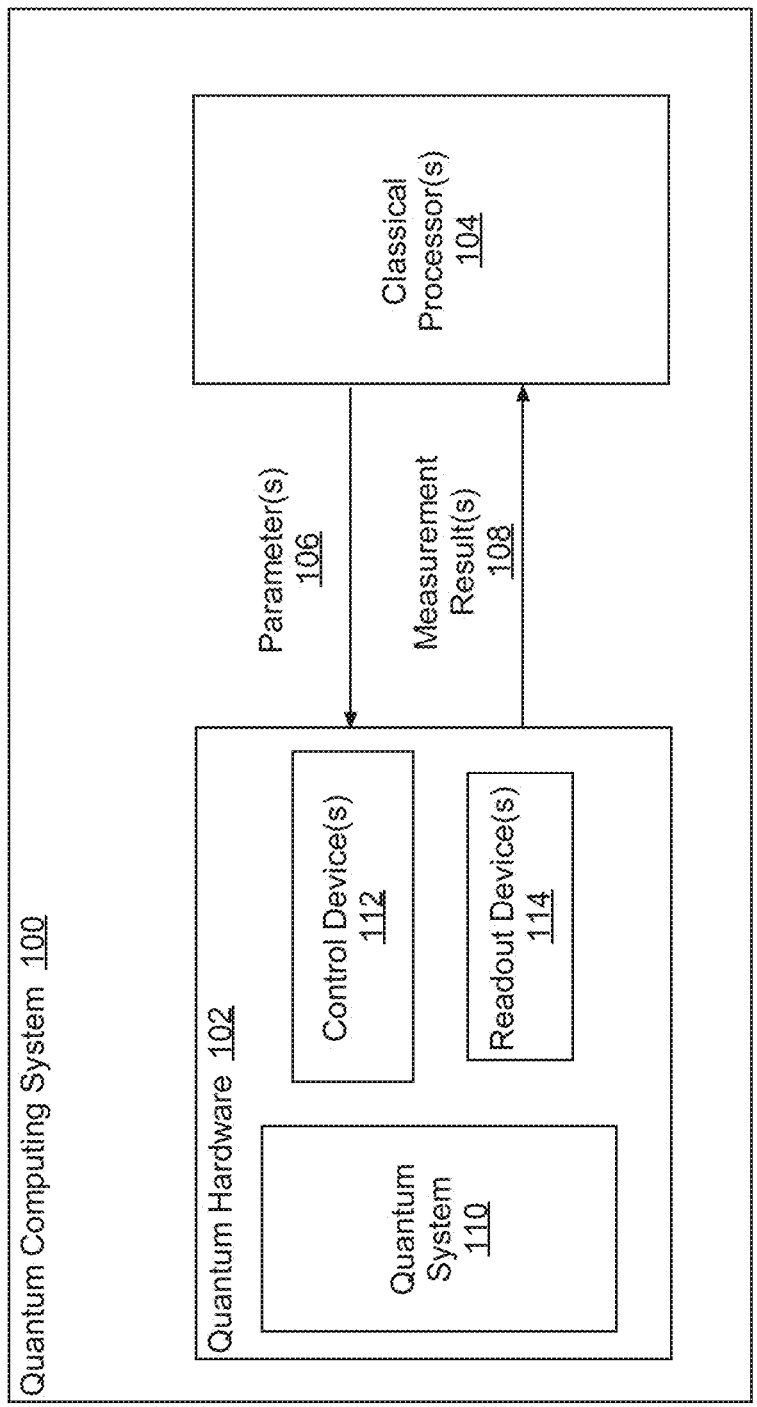
FIG. 1 depicts an example quantum computing system according to example embodiments of the present disclosure.

Example aspects of the present disclosure are directed to quantum computing systems having improved signal transmissions. One challenge in quantum computing relates to communications between a supercooled quantum system including quantum hardware (e.g., qubits) and a classical computing system (e.g., a binary computing system). Quantum computing systems can be at least partially controlled by a classical computing system that may be interfaced with electronic control and/or measurement devices (e.g., hardware). The classical computing system can be kept separate from the quantum hardware. For instance, the quantum hardware can be disposed in a vacuum chamber (e.g., in a vacuum formed by the vacuum chamber) and/or the classical computing system can be disposed outside of the vacuum chamber (e.g., outside of a vacuum formed by the vacuum chamber). The vacuum chamber may provide a temperature gradient between the classical computing system, which may operate at about room temperature, and the quantum hardware, which may operate at about absolute zero (e.g., less than about 20 millikelvin).

Quantum computing systems can require fast and robust communications between the classical computing system and the quantum system (e.g., qubits) to precisely and reliably implement quantum gate operations and/or quantum state measurements. To address this requirement, many systems employ physical signal lines, such as wires, between the classical computing system and quantum system.

Increasing complexity of quantum hardware (e.g., greater number of qubits) can present challenges with managing the physical signal lines between the classical computing system and quantum hardware. For instance, in some cases, each qubit can require one or more signal lines to transmit signals to and/or from the qubit. For instance, the number of required signal lines can grow at least near-linearly, if not greater than linearly, with the number of qubits in the quantum system. For instance, in some cases, four signal lines can be required for each qubit, even if some or all of the signal lines are multiplexed. Increasing density of quantum hardware can thus contribute to increasing density of signal lines and/or interconnects required between signal lines and components of the quantum computing system, such as the quantum hardware, an end (e.g., entrance) of the vacuum chamber, feed-throughs for different cooling stages, and/or other components. In addition, increasing complexity of quantum hardware can contribute to greater susceptibility to cross-talk, noise, interference, etc. Thus, the signal lines must provide sufficient performance for other considerations, such as thermal conductivity, noise and/or crosstalk robustness, and others.

As one example, many quantum computing applications employ superconducting qubits that achieve superconductivity, or zero electrical resistance, at temperatures around approximately absolute zero, or about 0 kelvin, such as less than about 3 kelvin. Thus, one challenge associated with quantum computing includes cooling quantum hardware with the superconducting qubits to a temperature at which the superconducting qubits achieve superconductivity, which can be dependent on transition temperatures of superconducting materials used for the superconducting qubits. For example, in some cases, the superconducting qubits must be cooled to less than about 0.1 kelvin (K), such as less than about 0.02 kelvin, or 20 millikelvin (mK). Additionally and/or alternatively, the superconducting qubits must be cooled to a temperature low enough such that thermal occupation of photons at frequencies of the qubits is sufficiently small. Typically, the classical computing system can be maintained at a higher temperature than the quantum hardware such as, for instance, at about room temperature. Physical signal lines may connect to the quantum hardware and thus form a thermal conductor between the classical computing system and quantum hardware. The physical signal lines can reduce the efficiency of a cooling system (e.g., a cryogenic cooling system) that is configured to cool the quantum hardware and/or other components of the quantum computing system. While even one signal line can thus cause increased cooling requirements, this problem can become more significant as quantum hardware continues to grow in complexity. Thus, signal lines coupling the quantum hardware to the classical computing system can desirably be physically small (e.g., densely arranged), provide a low heat load, provide low electrical dissipation, and/or provide other desirable thermal characteristics.

As another example, it can be desirable to accurately drive qubits with signals from the signal lines. For instance, signal reflections caused by the signal lines and/or other components of the quantum computing system (e.g., connectors) can negatively affect performance of the quantum hardware. Thus, the signal lines can desirably have low reflectivity (e.g., less than about 30 dB). Additionally and/or alternatively, the signal lines can desirably provide low distortion (e.g., pulse distortion) such that control signals are accurately transmitted through the signal line. Signal lines with low distortion can provide improved accurate control signal implementations and/or quantum algorithm execution at the quantum hardware and/or accurate readouts from the quantum hardware. Additionally and/or alternatively, the signal lines can desirably provide low crosstalk (e.g., less than about 60 dB) between distinct signal lines and/or other components. Signal lines providing low crosstalk can provide improved isolated qubit communications, such as providing that signals on a signal line intended for one qubit are isolated from other qubits and/or contribute to reduced noise at each additional signal line.

As another example, noise and/or other external factors can impact performance of a quantum computing system. Signal lines coupling the quantum hardware to the classical computing system can desirably provide little interference in an environment of the quantum hardware. For example, signal lines can desirably emit few to no thermal photons and/or contribute to other factors that could interfere with operation of the quantum hardware, especially through filtering of the signal lines. Additionally and/or alternatively, the quantum computing system can desirably block external thermal photons, signal noise, and/or other external factors from interfering with operation of the quantum hardware (e.g., by providing filtering and/or by blocking thermal photon pathways from higher temperatures within the environment, such as a vacuum chamber and/or external environment).

Systems and methods according to example aspects of the present disclosure can provide for quantum computing systems that provide solutions to these and/or other problems. According to example aspects of the present disclosure, a quantum computing system can include one or more classical processors and quantum hardware including one or more qubits. The quantum computing system can include a chamber mount configured to support the quantum hardware and a vacuum chamber configured to receive the chamber mount and dispose the quantum hardware in a vacuum. The vacuum chamber can form a cooling gradient from an end of the vacuum chamber to the quantum hardware. For example, the vacuum chamber can form a cooling gradient from a first temperature, such as room temperature (e.g., about 300 kelvin) to a second temperature, such as at or about absolute zero (e.g., about 10 millikelvin), such as to provide a temperature at the quantum hardware at which the qubits experience superconductivity. In some embodiments, the cooling gradient can be formed by a plurality of cooling stages having progressively increasing and/or decreasing temperatures. As one example, the cooling stages can be stages of a staged cryogenic cooling system, such as a dilution refrigerator.

The quantum computing system can include one or more signal lines between the classical processor(s) and quantum hardware. According to example aspects of the present disclosure, the quantum computing system can include one or more flex circuit boards including one or more signal lines. The flex circuit board(s) can be configured to transmit signals by the one or more signal lines through the vacuum chamber to couple the one or more classical processors to the quantum hardware. The flex circuit board(s) can include a plurality of signal lines and can provide a significantly improved signal line density, in addition to providing improved isolation, reduced thermal conductivity, and/or improved scalability. For instance, including flex circuit boards according to example aspects of the present disclosure to couple the classical processors to the quantum hardware can provide for infrastructure that reliably scales to the increasingly greater numbers of qubits that are achieved and/or expected in contemporary and/or future quantum computing systems.

As used herein, a "flex circuit board" refers to a board including at least one generally planar substrate (e.g., layered substrates) or other support on which the one or more signal lines are formed or otherwise disposed and having flexibility in at least one plane. As used herein, "flexibility" refers to a capability of deforming (e.g., subject to mechanical stress, etc.) without breaking. For example, a rectangular flex circuit board may be flexible along a largest surface of the rectangular flex circuit board. A rectangular flex circuit board may be flexible and/or rigid along at least a portion of its edges. The flexibility may be achieved as a property of material(s) from which the flex circuit board and/or layers of the flex circuit board is/are formed (e.g., metals, such as copper, copper alloys, niobium, aluminum, etc., dielectric materials, nonmetals, polymers, rubbers, etc.), achieved by hinging and/or segmenting of the flex circuit board (e.g., hinging and/or segmenting a rigid portion), and/or in any other suitable manner. The substrate(s) may be strictly planar (e.g., having a substantially linear cross-section across a length and width) and/or may be generally planar in that the substrate(s) bend, wrinkle, or are otherwise non-linear in at least one cross-section but generally represent a shape having a depth significantly less than (e.g., less than about 10% of) a length and width.

In some embodiments, the flex circuit board can include at least one ground layer. The ground layer can form an outer surface of the flex circuit board, such as an outer surface along the largest surface. In some embodiments, the flex circuit board can include two ground layers, such as two parallel and spaced apart ground layers. For instance, the two ground layers can form both largest outer surfaces of the flex circuit board. A ground layer can act as an electrical isolation layer to isolate signal lines on one side of the ground layer from interfering signals (e.g., from signal lines on other layers, other boards, the environment, etc.) on another side of the ground layer. For instance, the ground layer can be coupled to earth ground and/or other suitable ground(s).

The ground layer(s) can be or can include any suitable electrically conductive material. In some embodiments, the ground layer(s) can be or can include superconducting ground layer(s) including superconducting material(s), such as superconducting material(s) that achieve(s) superconductivity at temperatures below about 1 degree kelvin, such as about 0 degrees kelvin. As examples, the ground layer(s) can be or can include niobium, tin, aluminum, molybdenum disulfide, BSCCO, and/or other suitable superconducting materials. Additionally and/or alternatively, the ground layer(s) can be or can include material having high signal transfer performance characteristics, such as low resistance, low reflectivity, low distortion, etc. such that a signal is substantially unchanged by passing through the signal line. As examples, the ground layer(s) can be or can include copper, gold, and/or other suitable materials having high signal transfer performance characteristics. Additionally and/or alternatively, the ground layer(s) can be or can include material(s) having desirable thermal characteristics, such as suitably high and/or low thermal transfer, such as, for example, copper, copper alloy, thin superconducting materials, etc.

In some embodiments, the flex circuit board can include at least one dielectric layer. The dielectric layer(s) can be or can include any suitable dielectric material, such as dielectric polymers. In some embodiments, the dielectric layer(s) can be or can include flexible dielectric material. As one example, the dielectric layer(s) can be or can include polyimide. At least a portion of the dielectric layer(s) can be formed on or otherwise disposed proximate to at least a portion of an inner surface of the ground layer(s). For example, in some embodiments, an inner surface of a ground layer can be mated with an outer surface of a dielectric layer. Furthermore, in some embodiments, inner surfaces of two dielectric layers can be mated with signal lines disposed therebetween.

The flex circuit board can include one or more signal lines. The one or more signal lines can be disposed on a surface (e.g., an inner surface) of at least one dielectric layer. As an example, in some implementations, the one or more signal lines can be disposed between opposing inner surfaces of two dielectric layers. The signal line(s) can be or can include any suitable electrically conductive material. In some embodiments, the signal line(s) can be or can include superconducting signal line(s) including superconducting material(s), such as superconducting material(s) that achieve(s) superconductivity at temperatures below about 1 degree kelvin, such as about 0 degrees kelvin. As examples, the signal line(s) can be or can include niobium, tin, aluminum, molybdenum disulfide, BSCCO, and/or other suitable superconducting materials. Additionally and/or alternatively, the signal line(s) can be or can include material having high signal transfer performance characteristics. As examples, the signal line(s) can be or can include copper, gold, and/or other suitable materials having high signal transfer performance characteristics. Additionally and/or alternatively, the signal line(s) can be or can include material(s) having desirable thermal characteristics, such as, for example, copper, copper alloy, thin superconducting material, etc.

In some embodiments, the flex circuit board can include one or more vias. For instance, the vias can extend through the ground layer(s), the dielectric layer(s), and/or the signal line(s). The vias can serve to improve isolation of the signal lines. Additionally and/or alternatively, the vias can serve to couple multiple ground layers and/or transfer signals between layers of the flex circuit board. In some embodiments, the via(s) can be plated with via plate(s) that extend along the via(s). In some embodiments, the via plate(s) can be or can include conductive material, such as copper.

The quantum computing system can include quantum hardware in data communication with one or more classical processor(s). For instance, quantum hardware can represent and/or manipulate information using qubits. A qubit can be or include any suitable quantum device that enables the superposition of multiple states, e.g., both the "0" and "1" state. As one example, a qubit can be or include a unit of superconducting material, such as superconducting material that achieves superconductivity in at least temperatures below about 100 millikelvin, which can require operating at a reduced temperature, such as below about 100 millikelvin. In some embodiments, the quantum computing system can include one or more multi-level quantum subsystems, such as a register of qubits. In some implementations, the multi-level quantum subsystems can include superconducting qubits, such as flux qubits, charge qubits, transmon qubits, gmon qubits, etc.

The classical processor(s) can be binary processors, such as processors that operate on data represented as a plurality of bits. As one example, bits can be represented by a voltage differential between a low voltage (e.g., 0V) and a high voltage (e.g., 5V) at a point of reference, such as a memory cell, circuit node, etc. The low voltage can be associated with a "0" state and the high voltage can be associated with a "1" state. The classical processor(s) can be configured to, in addition to any other suitable function(s) of the classical processor(s), control the quantum hardware. For instance, the classical processor(s) can be coupled to the quantum hardware (e.g., by signal lines included in flex circuit boards according to example aspects of the present disclosure) and/or configured to send control signals to perform quantum operations using the quantum hardware. As one example, the classical processor(s) can be configured to send control signals that implement quantum gate operations at the quantum hardware (e.g., by control device(s)). Additionally and/or alternatively, the classical processor(s) can be configured to send control signals that cause the quantum hardware to perform quantum state measurements and/or provide the quantum state measurements to the classical processor(s) (e.g., by readout device(s)). For example, the classical processor(s) can receive measurements of the quantum system that can be interpretable by the classical processor(s).

According to example aspects of the present disclosure, the quantum computing system can include one or more flex circuit boards including one or more signal lines. The classical processor(s) can be coupled to at least one first flex circuit board. For instance, the classical processor(s) can be coupled to the first flex circuit board(s) by a classical-flex interconnect. The classical-flex interconnect can convert from a classical signal transmission medium (e.g., a coaxial cable) to the first flex circuit board(s).

As one example, the classical-flex interconnect can be or can include a compression interposer. The compression interposer can include an array (e.g., a two-dimensional array) of spring pads. A connector receiving signals from the classical processor(s), such as via one or more coaxial cables (e.g., one coaxial cable per signal line) can be compressed against the compression interposer to form signal communications between the spring pads and the connector (e.g., the coaxial cables). The spring pads can each be coupled to a signal line on the flex circuit board such that signals can be transmitted from the classical processor(s) (e.g., the coaxial cables) to the signal lines. The compression interposer can provide for connecting signal transmission media having a relatively lower spatial density such as coaxial cables, which may occupy a relatively larger amount of space per cable, to signal transmission media having a relatively higher spatial density, such as signal lines embedded in a flex circuit board provided according to example aspects of the present disclosure. Additionally, the compression interposer can achieve high isolation between signal lines and/or low reflectivity along a signal line that is/are suitable for quantum computing applications.

In some embodiments, the first flex circuit board(s) can be or can include a first flex circuit board material at the ground layer(s) and/or the signal line(s). The first flex circuit board material can be selected to provide high signal transfer performance characteristics. As examples, the first flex circuit board material can be or can include copper, brass, gold, and/or other suitable materials having high signal transfer performance characteristics. For instance, the first flex circuit board(s) can include copper signal lines and/or ground layer(s) to provide high signal transfer performance characteristics.

The first flex circuit board(s) can pass through a hermetic seal positioned at an end (e.g., an entrance) of the vacuum chamber. For example, a flex circuit board can be configured to pass through the hermetic seal such that a first portion of the flex circuit board is disposed in the vacuum chamber and a second portion of the flex circuit board is disposed outside of the vacuum chamber while the hermetic seal forms a vacuum seal for the vacuum chamber. The hermetic seal can provide for the first flex circuit board(s) to enter the vacuum chamber without (e.g., substantially) destroying a vacuum created by the vacuum chamber. As one example, the hermetic seal can include a fitted seal for each first flex circuit board. The fitted seal(s) can receive the first flex circuit board(s) and form a vacuum seal with surface(s) of the first flex circuit board(s). Additionally, the hermetic seal can include one or more seal slots configured to receive the fitted seal(s) and/or the first flex circuit board(s). For example, the fitted seal(s) can form a vacuum seal with the seal slot(s) while allowing the first flex circuit board(s) to pass through the seal slot(s) and into the vacuum chamber. In this way, the flex circuit board(s) can enter the vacuum chamber without experiencing signal disruptions from breaks in the circuit boards, as the boards can continuously pass into the vacuum chamber. In some embodiments, the hermetic seal can include fastening systems to secure the fitted seals to the seal slots and/or form a vacuum seal, such as, for example, screws, bolts, seal rings, O rings, etc. In some embodiments, the hermetic seal can form a vacuum seal without requiring adhesive material (e.g., glue, resin, etc.) such that, for example, residual adhesive material does not contaminate the flex circuit boards.

The first flex circuit board(s) can be coupled to at least one second flex circuit board(s). The first flex circuit board(s) can be coupled to the second flex circuit board(s) by at least one flex-flex interconnect. For instance, the flex-flex interconnect(s) can couple (structurally and/or electrically) the ground layer(s), dielectric layer(s), and/or signal line(s) of a first flex circuit board to a second flex circuit board. As examples, the flex-flex interconnect(s) can be formed by soldering, welding, and/or otherwise fusing components of a first flex circuit board to a second flex circuit board. The flex-flex interconnect(s) can be or can include any suitable interconnection of two flex circuit board(s) such as, for example, a butt joint, an overlap joint, a spring array joint (e.g., where boards overlap and are coupled by a spring array connector, such as a compression interposer) and/or any other suitable interconnection(s).

In some embodiments, the second flex circuit board(s) can be coupled to at least one surface mount attenuator board. For instance, the surface mount attenuator board can be a flexible printed circuit board. In some embodiments, the surface mount attenuator board(s) can be or can include a surface mount attenuator board material at the ground layer(s) and/or the signal line(s). The surface mount attenuator board material can be selected to provide high signal transfer performance characteristics. As examples, the surface mount attenuator board material can be or can include copper, brass, gold, and/or other suitable materials having high signal transfer performance characteristics. For instance, the surface mount attenuator board(s) can include copper signal lines and/or ground layer(s) to provide high signal transfer performance characteristics.

The surface mount attenuator board(s) can include one or more surface mount attenuators. The surface mount attenuator(s) can be configured to attenuate or block thermal photon interference. In some embodiments, the surface mount attenuator board(s) and/or the surface mount attenuator(s) can be placed at a temperature cold enough such that the surface mount attenuator(s) do not produce thermal photons. In some embodiments, the surface mount attenuator(s) can be disposed in an isolation plate. The isolation plate can be configured to isolate the one or more surface mount attenuators. The isolation plate can be attached to the surface mount attenuator board(s). In some embodiments, the isolation plate can be mounted to a ground layer and/or grounded. The isolation plate can include one or more cavities configured to isolate a first surface mount attenuator from a second surface mount attenuator. For example, the cavities can surround the first surface mount attenuator in a direction of a second surface mount attenuator and block cross-talk between attenuators.

The second flex circuit board(s) can have at least a different material composition from the first flex circuit board(s). In some embodiments, the second flex circuit board(s) can be or can include a second flex circuit board material at the ground layer(s) and/or the signal line(s). The second flex circuit board material can be selected to provide high signal transfer performance characteristics and/or reduced thermal conductivity. As examples, the second flex circuit board material can be or can include a copper alloy and/or other suitable materials having desirable thermal characteristics. For instance, the second flex circuit board(s) can include copper alloy signal lines and/or ground layer(s) to provide reduced thermal conductivity from the upper portions of the vacuum chamber and/or dispelling heat produced at the surface mount attenuators. For instance, the surface mount attenuators can produce more heat than surrounding components, and the second flex circuit board material can be selected to transfer the increased heat away from the attenuators and/or quantum hardware in addition to and/or alternatively to providing desirable signal transfer characteristics. For instance, the material (e.g., copper alloy) can be chosen to reduce a thermal load on the attenuators while mitigating electrical loss. As one example, the copper alloy can be or can include C194.

The quantum computing system can include at least one third flex circuit board. For instance, the second flex circuit board(s) and/or the surface mount attenuator board(s) can be coupled to the third flex circuit board(s), such as by any suitable flex-flex interconnect (e.g., a butt joint, overlap joint, etc.). The third flex circuit board(s) can be positioned at a point in the vacuum chamber at which the cooling gradient is cool enough such that some materials exhibit superconductivity. For example, at least a portion of the third flex circuit board(s) can have a temperature of less than about three kelvin.

In some embodiments, the third flex circuit board(s) can be or can include a third flex circuit board material at the ground layer(s) and/or the signal line(s). The third flex circuit board material can be selected to be superconducting at a temperature which at least a portion of the third flex circuit board(s) experiences superconductivity. As examples, the third flex circuit board material can be or can include niobium, tin, aluminum, and/or other suitable superconducting materials. For instance, the third flex circuit board(s) can include copper-plated niobium signal lines and/or ground layer(s) to provide superconductivity. For instance, the copper plating on the copper-plated niobium board(s) can be useful in interfacing with the superconducting niobium, which can provide for improved signal transfer characteristics. In some embodiments, the copper-plated niobium board(s) can be formed by first applying a layer of niobium, followed by a thin layer of copper to prevent the formation of oxides, then a thicker layer of copper.

In some embodiments, the third flex circuit board(s) can be coupled to at least one fourth flex circuit board(s) such as by any suitable flex-flex interconnect (e.g., a butt joint, overlap joint, etc.). The fourth flex circuit board(s) can couple the third flex circuit board(s) to the quantum hardware. For example, a connector at an end of the fourth flex circuit board(s) can attach to a port that is in signal communication with the quantum hardware. As one example, the connector can be a T-joint connector, such as a T-joint connector including superconducting materials (e.g., tin). Additionally and/or alternatively, the connector may be a planar spring array.

In some embodiments, the fourth flex circuit board(s) can be or can include a fourth flex circuit board material at the ground layer(s) and/or the signal line(s). The fourth flex circuit board material can be selected to provide high signal transfer performance characteristics. As examples, the fourth flex circuit board material can be or can include copper, brass, gold, and/or other suitable materials having high signal transfer performance characteristics. For instance, the fourth flex circuit board(s) can include copper signal lines and/or ground layer(s) to provide high signal transfer performance characteristics. Additionally and/or alternatively, the fourth flex circuit board material can be selected to be superconducting at a temperature at which at least a portion of the fourth flex circuit board(s) operates. As examples, the fourth flex circuit board material can be or can include niobium, tin, aluminum, and/or other suitable superconducting materials.

In some embodiments, the fourth flex circuit board(s) can be or can include a filter, such as an XYZ and/or IR filter. For instance, the filter can be configured to reduce effects of noise, thermal photons, and/or other potential sources of interference. As one example, the filter can include a cavity in the fourth flex circuit board(s) that is filled with a particulate suspension to provide XYZ/IR filtering.

Systems and methods according to example aspects of the present disclosure can provide for a number of technical effects and benefits. For example, including flex circuit boards to couple classical processor(s) to quantum hardware according to example aspects of the present disclosure can provide for quantum computing systems having improved signal transfer characteristics, reduced susceptibility to noise, improved thermal handling characteristics, improved scalability to increasingly larger numbers of qubits, and/or other benefits.

As used herein, the use of the term "about" or "approximately" in conjunction with a stated numerical value is intended to refer to within 10% of the stated numerical value.

With reference now to the FIGS., example embodiments of the present disclosure will be discussed in further detail.

FIG. 1 depicts an example quantum computing system 100. The example system 100 is an example of a system implemented as a classical or quantum computer program on one or more classical computers or quantum computing devices in one or more locations, in which the systems, components, and techniques described below can be implemented. FIG. 1 depicts an example quantum computing system that can be used to implement aspects of the present disclosure. Those of ordinary skill in the art, using the disclosures provided herein, will understand that other quantum computing structures or systems can be used without deviating from the scope of the present disclosure.

The system 100 includes quantum hardware 102 in data communication with one or more classical processor(s) 104. For instance, quantum hardware 102 can represent and/or manipulate information using qubits. A qubit can be or include any suitable quantum device that enables the superposition of multiple states, e.g., data in both the "0" and "1" state. As one example, a qubit can be or include a unit of superconducting material, such as superconducting material that achieves superconductivity at a temperature less than about 3 kelvin, such as about 1 kelvin, such as about 20 millikelvin.

The quantum hardware 102 can include components for performing quantum computation. For example, the quantum hardware 102 can include a quantum system 110, control device(s) 112, and readout device(s) 114 (e.g., readout resonator(s)). The quantum system 110 can include one or more multi-level quantum subsystems, such as a register of qubits. In some implementations, the multi-level quantum subsystems can include superconducting qubits, such as flux qubits, charge qubits, transmon qubits, gmon qubits, etc.

The classical processor(s) 104 can be binary processors, such as processors that operate on data represented as a plurality of bits. As one example, bits can be represented by a voltage differential between a low voltage (e.g., 0V) and a high voltage (e.g., 5V) at a point of reference, such as a memory cell, circuit node, etc. The low voltage can be associated with a "0" state and the high voltage can be associated with a "1" state. The classical processor(s) 104 can be configured to, in addition to any other suitable function(s) of the classical processor(s) 104, control the quantum hardware 102. For instance, the classical processor(s) 104 can be coupled to the quantum hardware 102 (e.g., by signal lines) and/or configured to send control signals to perform quantum operations using the quantum hardware 102. As one example, the classical processor(s) 104 can be configured to send control signals that implement quantum gate operations at the quantum hardware 102 (e.g., by control device(s) 112). Additionally and/or alternatively, the classical processor(s) 104 can be configured to send control signals that cause the quantum hardware 102 to perform quantum state measurements and/or provide the quantum state measurements to the classical processor(s) 104 (e.g., by readout device(s) 114). For example, the classical processor(s) 104 can receive measurements of the quantum system 110 that can be interpretable by the classical processor(s) 104.

The type of multi-level quantum subsystems that the system 100 utilizes may vary. For example, in some cases it may be convenient to include one or more readout device(s) 114 attached to one or more superconducting qubits, e.g., transmon, flux, gmon, xmon, or other qubits.

Quantum circuits may be constructed and applied to the register of qubits included in the quantum system 110 via multiple signal lines (e.g., signal lines 120 of FIG. 2) that are coupled to one or more control devices 112. Example control devices 112 that operate on the register of qubits can be used to implement quantum logic gates or circuits of quantum logic gates, e.g., Hadamard gates, controlled-NOT (CNOT) gates, controlled-phase gates, T gates, multi-qubit quantum gates, coupler quantum gates, etc. The one or more control devices 112 may be configured to operate on the quantum system 110 through one or more respective control parameters (e.g., one or more physical control parameters). For example, in some implementations, the multi-level quantum subsystems may be superconducting qubits and the control devices 112 may be configured to provide control pulses to control lines (e.g., signal lines 120 of FIG. 2) to generate magnetic fields to adjust a frequency of the qubits.

The quantum hardware 102 may further include readout devices 114 (e.g., readout resonators). Measurement results 108 obtained via measurement devices may be provided to the classical processors 104 for processing and analyzing. In some implementations, the quantum hardware 102 may include a quantum circuit and the control device(s) 112 and readout devices(s) 114 may implement one or more quantum logic gates that operate on the quantum system 110 through physical control parameters (e.g., microwave pulse) that are sent through wires included in the quantum hardware 102. Further examples of control devices include arbitrary waveform generators, wherein a DAC creates the signal.

The readout device(s) 114 may be configured to perform quantum measurements on the quantum system 110 and send (e.g., by signal lines 120 of FIG. 2) measurement results 108 to the classical processors 104. In addition, the quantum hardware 102 may be configured to receive data (e.g., by signal lines 120 of FIG. 2) specifying physical control parameter values 106 from the classical processors 104. The quantum hardware 102 may use the received physical control parameter values 106 to update the action of the control device(s) 112 and readout devices(s) 114 on the quantum system 110. For example, the quantum hardware 102 may receive data specifying new values representing voltage strengths of one or more DACs included in the control devices 112 and may update the action of the DACs on the quantum system 110 accordingly. The classical processors 104 may be configured to initialize the quantum system 110 in an initial quantum state, e.g., by sending data to the quantum hardware 102 specifying an initial set of parameters 106.

The readout device(s) 114 can take advantage of a difference in the impedance for the |0⟩ and |1⟩ states of an element of the quantum system, such as a qubit, to measure the state of the element (e.g., the qubit). For example, the resonance frequency of a readout resonator can take on different values when a qubit is in the state |0⟩ or the state |1⟩, due to the nonlinearity of the qubit. Therefore, a microwave pulse reflected from the readout device 114 carries an amplitude and phase shift that depend on the qubit state. In some implementations, a Purcell filter can be used in conjunction with the readout device(s) 114 to impede microwave propagation at the qubit frequency.

The system 100 includes control device(s) 112. Control device(s) 112 can operate the quantum hardware 102. For example, control device(s) 112 can include a waveform generator configured to generate control pulses according to example aspects of the present disclosure.

In some implementations, the control device(s) 112 may include a data processing apparatus and associated memory. The memory may include a computer program having instructions that, when executed by the data processing apparatus, cause the data processing apparatus to perform one or more functions described herein, such as applying a control signal to a qubit and/or to a tunable coupler.

Figure 2:
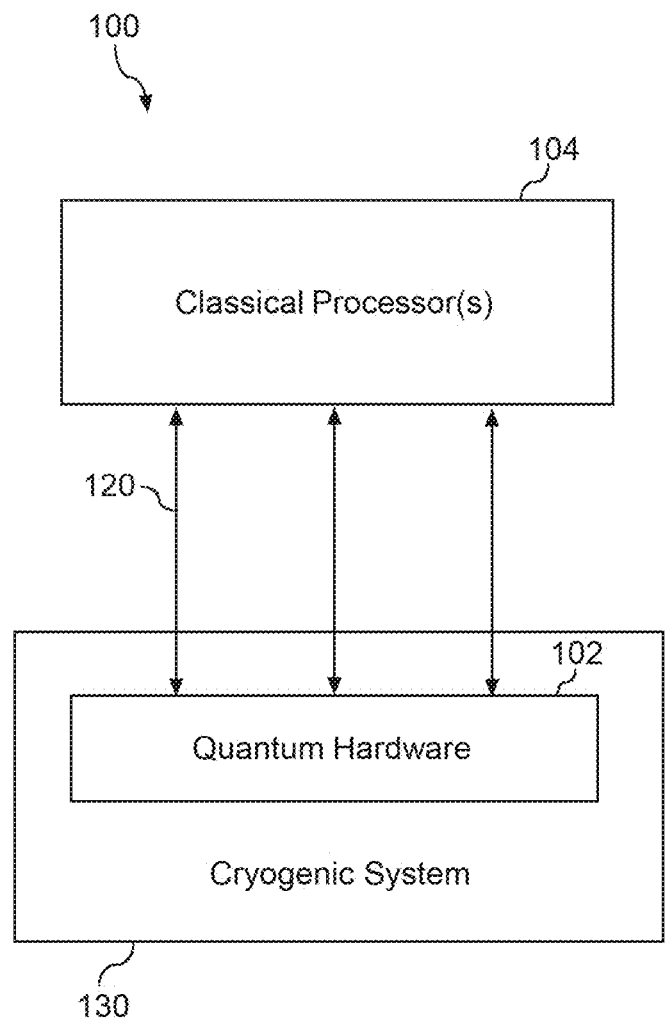
FIG. 2 depicts an example quantum computing system according to example embodiments of the present disclosure.

FIG. 2 depicts an example quantum computing system 100 according to example embodiments of the present disclosure. As illustrated in FIG. 2, quantum hardware 102, such as, but not limited to, quantum system 110, control device(s) 112, readout device(s) 114, and/or any other suitable components of quantum hardware 102 discussed with regard to FIG. 1, can be located within cryogenic cooling system 130. Additionally and/or alternatively, classical processor(s) 104 can be located outside cryogenic cooling system 130. Cryogenic cooling system 130 can be or can be located in a vacuum chamber. For example, the quantum hardware 102 and/or signal line(s) 120 (e.g., flex circuit boards) can be supported by a chamber mount that is configured to be inserted into a vacuum cannister to form a vacuum chamber. For instance, the chamber mount can be configured to dispose the quantum hardware 102 in a vacuum (e.g., formed by the vacuum chamber). The cryogenic cooling system 130 configured to provide a temperature gradient (e.g., a plurality of cooling stages) within the vacuum chamber. For example, a temperature gradient can be formed by a plurality of cryogenic cooling stages, such as stages of a dilution refrigerator. Example stages of a dilution refrigerator can be or can include, for example, a first intermediate clamp stage, a first stage pulse tube stage, a second intermediate clamp stage, a second stage pulse tube stage, a still stage, an intermediate heat exchanger stage, a mixing chamber stage, a Joule-Thompson cooling stage, a helium liquefier stage, and/or any other suitable stages of a dilution refrigerator.

Cryogenic cooling system 130 can be configured to cool quantum hardware 102. Additionally and/or alternatively, classical processor(s) 104 are not cooled by cryogenic cooling system 130. For instance, classical processor(s) 104 can operate at a temperature around room temperature (e.g., around 300 kelvin) and/or temperatures around about 100 kelvin, whereas quantum hardware 102 can operate at temperatures around about absolute zero (e.g., less than about 1 kelvin) which can thus require cooling by cryogenic cooling system 130 to effectively operate.

Quantum computing system 100 can include signal line(s) 120. The signal line(s) 120 can couple classical processor(s) 104 to quantum hardware 102. For instance, as classical processor(s) 104 and quantum hardware 102 can be in signal communication, such as to transmit parameter(s) 106 and/or measurement result(s) 108 of FIG. 1 in addition to any other suitable signals, the classical processor(s) 104 can be coupled to quantum hardware 102 by signal lines 120. For instance, according to example aspects of the present disclosure, signal lines 120 can be or can include one or more flex circuit boards, such as superconducting flex circuit boards, that is/are configured to couple quantum hardware 102 and classical processor(s) 104. Generally, signal lines 120 include physical connections to allow for faster and/or more robust communication between quantum hardware 102 and classical processor(s) 104. As illustrated in FIG. 2, signal lines 120 can be at least partially located in cryogenic cooling system 130 to provide coupling to quantum hardware 102. Increasing density of signal lines 120 (e.g., associated with increasing complexity of quantum hardware 102) can present challenges in operating quantum computing system 100, which can be mitigated by the inclusion of flex circuit boards according to example aspects of the present disclosure.

Figure 3:
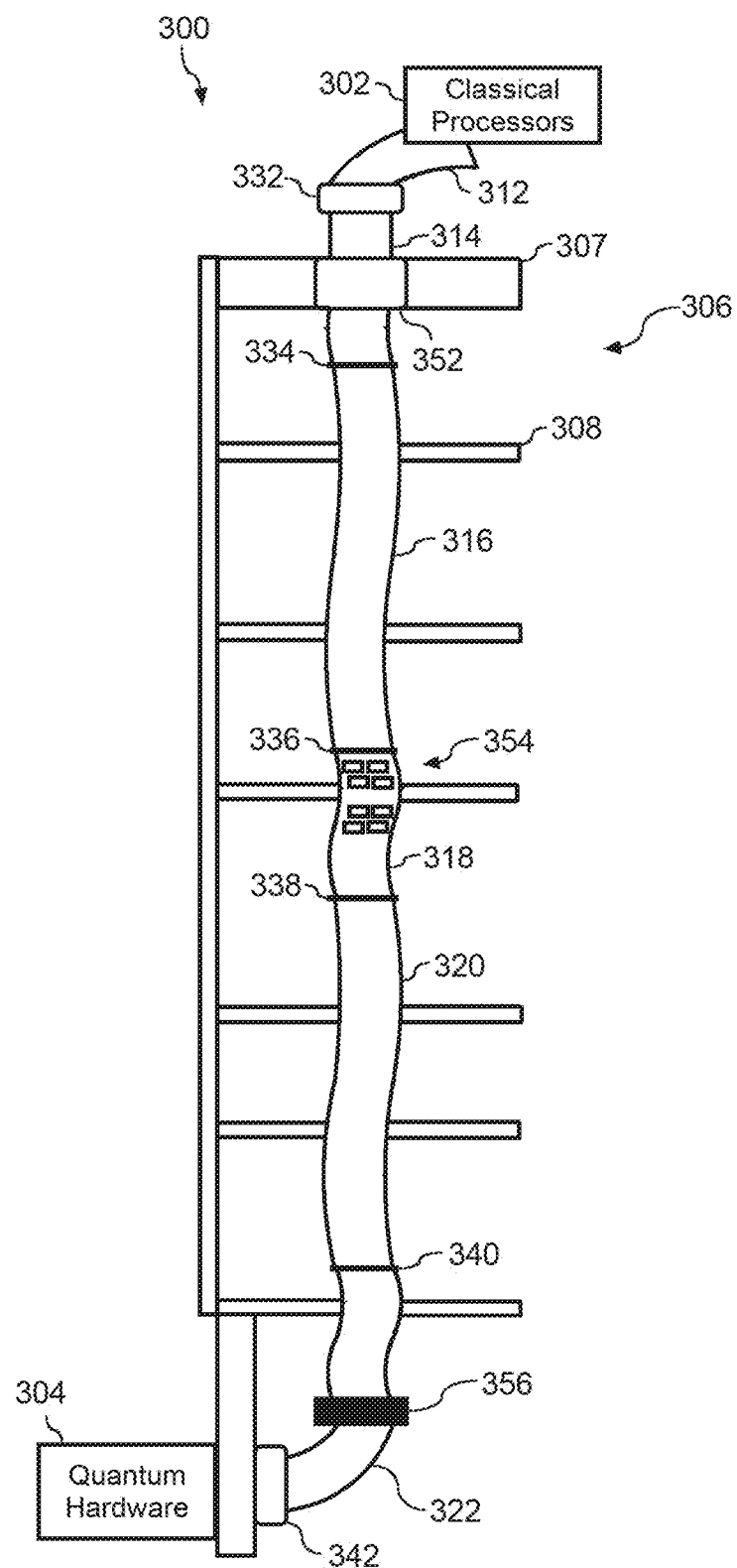
FIG. 3 depicts an example quantum computing system according to example embodiments of the present disclosure.

FIG. 3 depicts an example quantum computing system 300 according to example embodiments of the present disclosure. The quantum computing system 300 can include one or more classical processors 302 and quantum hardware 304 including one or more qubits. The quantum computing system 300 can include a chamber mount 308 configured to support the quantum hardware 304 and a vacuum chamber configured to receive the chamber mount 308 and dispose the quantum hardware 304 in a vacuum. The vacuum chamber can form a cooling gradient from an end of the vacuum chamber (e.g., cap 307) to the quantum hardware 304. For example, the vacuum chamber can form a cooling gradient from a first temperature, such as room temperature (e.g., about 300 kelvin) to a second temperature, such as at or about absolute zero (e.g., about 10 millikelvin), such as to provide a temperature at the quantum hardware 304 at which the qubits experience superconductivity. In some embodiments, the cooling gradient can be formed by a plurality of cooling stages having progressively increasing and/or decreasing temperatures. As one example, the cooling stages can be stages of a staged cryogenic cooling system, such as a dilution refrigerator.

Figure 4:
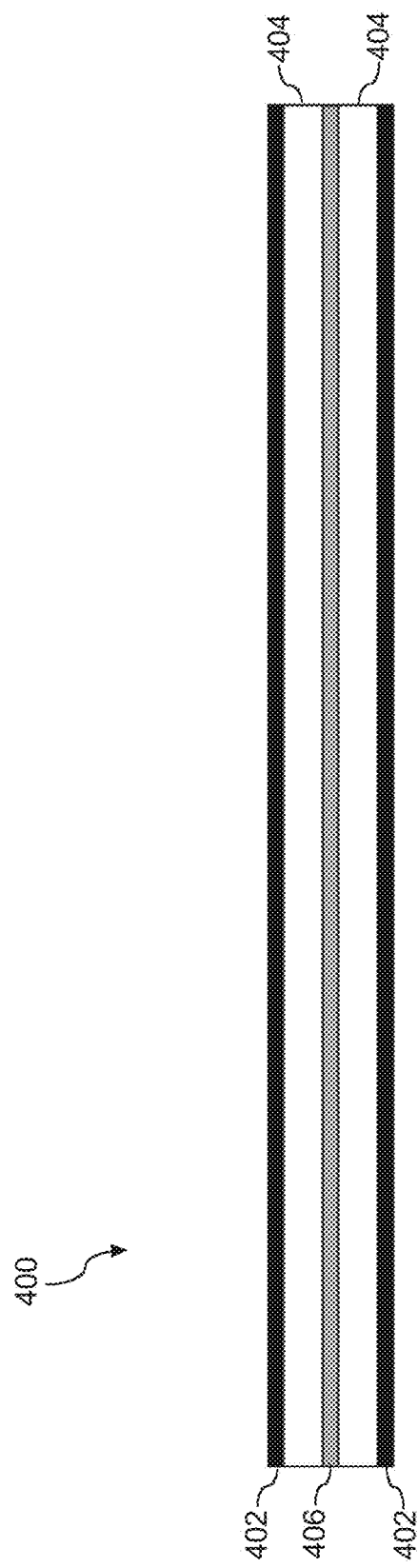
FIG. 4 depicts a cross-sectional view of an example flex circuit board according to example embodiments of the present disclosure.
Figure 5:
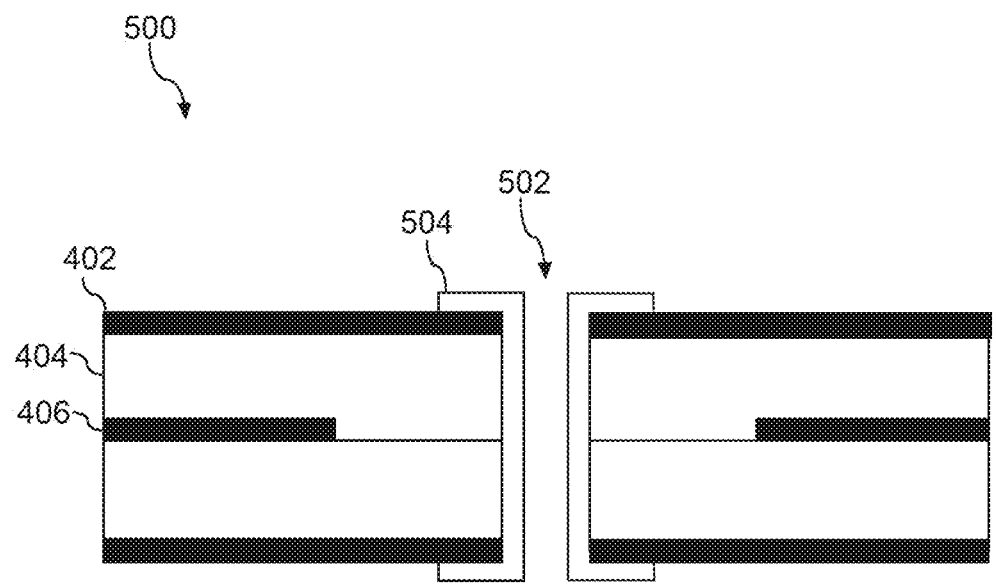
FIG. 5 depicts a cross-sectional view of an example flex circuit board according to example embodiments of the present disclosure.
Figure 6:
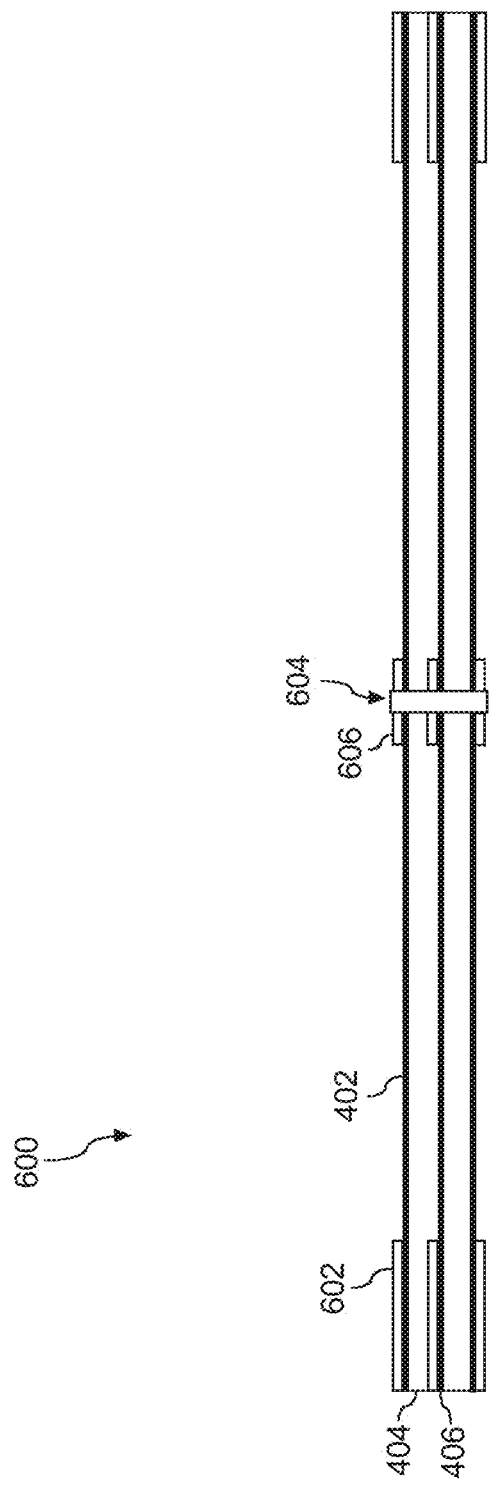
FIG. 6 depicts a cross-sectional view of an example flex circuit board according to example embodiments of the present disclosure.

The quantum computing system 300 can include one or more signal lines between the classical processor(s) 302 and quantum hardware 304. According to example aspects of the present disclosure, the quantum computing system 300 can include one or more flex circuit boards 306 including one or more signal lines. The flex circuit board(s) 306 can be configured to transmit signals by the one or more signal lines through the vacuum chamber to couple the one or more classical processors 302 to the quantum hardware 304. The flex circuit board(s) 306 can include a plurality of signal lines and can provide a significantly improved signal line density, in addition to providing improved isolation, reduced thermal conductivity, and/or improved scalability. For instance, including flex circuit boards 306 according to example aspects of the present disclosure to couple the classical processors 302 to the quantum hardware 304 can provide for infrastructure that reliably scales to the increasingly greater numbers of qubits that are achieved and/or expected in contemporary and/or future quantum computing systems. Example flex circuit boards that may be employed in accordance with example aspects of the present disclosure are illustrated in FIGS. 4-6

In some embodiments, some or all of the flex circuit board(s) 306 can include at least one ground layer. The ground layer can form an outer surface of the flex circuit board 306, such as an outer surface along the largest surface. In some embodiments, the flex circuit board 306 can include two ground layers, such as two parallel and spaced apart ground layers. For instance, the two ground layers can form both largest outer surfaces of the flex circuit board 306. A ground layer can act as an electrical isolation layer to isolate signal lines on one side of the ground layer from interfering signals (e.g., from signal lines on other layers, other boards, the environment, etc.) on another side of the ground layer. For instance, the ground layer can be coupled to earth ground and/or other suitable ground(s).

The ground layer(s) can be or can include any suitable electrically conductive material. In some embodiments, the ground layer(s) can be or can include superconducting ground layer(s) including superconducting material(s), such as superconducting material(s) that achieve(s) superconductivity at a temperature less than about 3 kelvin, such as about 1 kelvin, such as about 20 millikelvin. As examples, the ground layer(s) can be or can include niobium, tin, aluminum, molybdenum disulfide, BSCCO, and/or other suitable superconducting materials. Additionally and/or alternatively, the ground layer(s) can be or can include material having high signal transfer performance characteristics, such as low resistance, low reflectivity, low distortion, etc. such that a signal is substantially unchanged by passing through the signal line. As examples, the ground layer(s) can be or can include copper, gold, and/or other suitable materials having high signal transfer performance characteristics. Additionally and/or alternatively, the ground layer(s) can be or can include material(s) having desirable thermal characteristics, such as suitably high and/or low thermal transfer, such as, for example, copper, copper alloy, etc.

In some embodiments, the flex circuit board 306 can include at least one dielectric layer. The dielectric layer(s) can be or can include any suitable dielectric material, such as dielectric polymers. In some embodiments, the dielectric layer(s) can be or can include flexible dielectric material. As one example, the dielectric layer(s) can be or can include polyimide. At least a portion of the dielectric layer(s) can be formed on or otherwise disposed proximate to at least a portion of an inner surface of the ground layer(s). For example, in some embodiments, an inner surface of a ground layer can be mated with an outer surface of a dielectric layer. Furthermore, in some embodiments, inner surfaces of two dielectric layers can be mated with signal lines disposed therebetween.

The flex circuit board 306 can include one or more signal lines. The one or more signal lines can be disposed on a surface (e.g., an inner surface) of at least one dielectric layer. As an example, in some implementations, the one or more signal lines can be disposed between opposing inner surfaces of two dielectric layers. The signal line(s) can be or can include any suitable electrically conductive material. In some embodiments, the signal line(s) can be or can include superconducting signal line(s) including superconducting material(s), such as superconducting material(s) that achieve(s) superconductivity at a temperature less than about 3 kelvin, such as about 1 kelvin, such as about 20 millikelvin. As examples, the signal line(s) can be or can include niobium, tin, aluminum, and/or other suitable superconducting materials. Additionally and/or alternatively, the signal line(s) can be or can include material having high signal transfer performance characteristics. As examples, the signal line(s) can be or can include copper, gold, and/or other suitable materials having high signal transfer performance characteristics. Additionally and/or alternatively, the signal line(s) can be or can include material(s) having desirable thermal characteristics, such as, for example, copper, copper alloy, etc.

In some embodiments, the flex circuit board 306 can include one or more vias. For instance, the vias can extend through the ground layer(s), the dielectric layer(s), and/or the signal line(s). Additionally and/or alternatively, the vias can serve to couple multiple ground layers and/or transfer signals between layers of the flex circuit board. The vias can serve to improve isolation of the signal lines. In some embodiments, the via(s) can be plated with via plate(s) that extend along the via(s). In some embodiments, the via plate(s) can be or can include conductive material, such as copper.

For instance, in some embodiments, a quantum computing system 300 can include quantum hardware 304 in data communication with one or more classical processor(s) 302. For instance, quantum hardware 304 can represent and/or manipulate information using qubits. A qubit can be or include any suitable quantum device that enables the superposition of multiple states, e.g., both the "0" and "1" state. As one example, a qubit can be or include a unit of superconducting material, such as superconducting material that achieves superconductivity at a temperature less than about 3 kelvin, such as about 1 kelvin, such as about 20 millikelvin. In some embodiments, the quantum computing system 300 can include one or more multi-level quantum subsystems, such as a register of qubits. In some implementations, the multi-level quantum subsystems can include superconducting qubits, such as flux qubits, charge qubits, transmon qubits, gmon qubits, etc.

The classical processor(s) 302 can be binary processors, such as processors that operate on data represented as a plurality of bits. As one example, bits can be represented by a voltage differential between a low voltage (e.g., 0V) and a high voltage (e.g., 5V) at a point of reference, such as a memory cell, circuit node, etc. The low voltage can be associated with a "0" state and the high voltage can be associated with a "1" state. The classical processor(s) 302 can be configured to, in addition to any other suitable function(s) of the classical processor(s) 302, control the quantum hardware 304. For instance, the classical processor(s) 302 can be coupled to the quantum hardware 304 (e.g., by signal lines included in flex circuit boards 306 according to example aspects of the present disclosure) and/or configured to send control signals to perform quantum operations using the quantum hardware 304. As one example, the classical processor(s) 302 can be configured to send control signals that implement quantum gate operations at the quantum hardware 304 (e.g., by control device(s)). Additionally and/or alternatively, the classical processor(s) 302 can be configured to send control signals that cause the quantum hardware 304 to perform quantum state measurements and/or provide the quantum state measurements to the classical processor(s) 302 (e.g., by readout device(s)). For example, the classical processor(s) 302 can receive measurements of the quantum system that can be interpretable by the classical processor(s) 302.

According to example aspects of the present disclosure, the quantum computing system 300 can include one or more flex circuit boards 306 including one or more signal lines. The classical processor(s) 302 can be coupled to at least one first flex circuit board. For instance, the classical processor(s) 302 can be coupled to the first flex circuit board(s) 314 by a classical-flex interconnect 332. The classical-flex interconnect 332 can convert from a classical signal transmission medium (e.g., a coaxial cable) 312 to the first flex circuit board(s) 314.

As one example, the classical-flex interconnect 332 can be or can include a compression interposer. The compression interposer can include an array (e.g., a two-dimensional array) of spring pads. A connector receiving signals from the classical processor(s) 302, such as via one or more coaxial cables 312 (e.g., one coaxial cable 312 per signal line) can be compressed against the compression interposer to form signal communications between the spring pads and the connector (e.g., the coaxial cables). The spring pads can each be coupled to a signal line on the first flex circuit board 314 such that signals can be transmitted from the classical processor(s) 302 (e.g., the coaxial cables) to the signal lines. The compression interposer can provide for connecting signal transmission media 312 having a relatively lower spatial density, such as coaxial cables, which may occupy a relatively larger amount of space per cable, to signal transmission media having a relatively higher spatial density, such as signal lines embedded in a first flex circuit board 314 provided according to example aspects of the present disclosure. Additionally, the compression interposer can achieve high isolation between signal lines and/or low reflectivity along a signal line that is/are suitable for quantum computing applications.

In some embodiments, the first flex circuit board(s) 314 can be or can include a first flex circuit board material at the ground layer(s) and/or the signal line(s). The first flex circuit board material can be selected to provide high signal transfer performance characteristics. As examples, the first flex circuit board material can be or can include copper, brass, gold, and/or other suitable materials having high signal transfer performance characteristics. For instance, the first flex circuit board(s) 314 can include copper signal lines and/or ground layer(s) to provide high signal transfer performance characteristics.

Figure 10A:
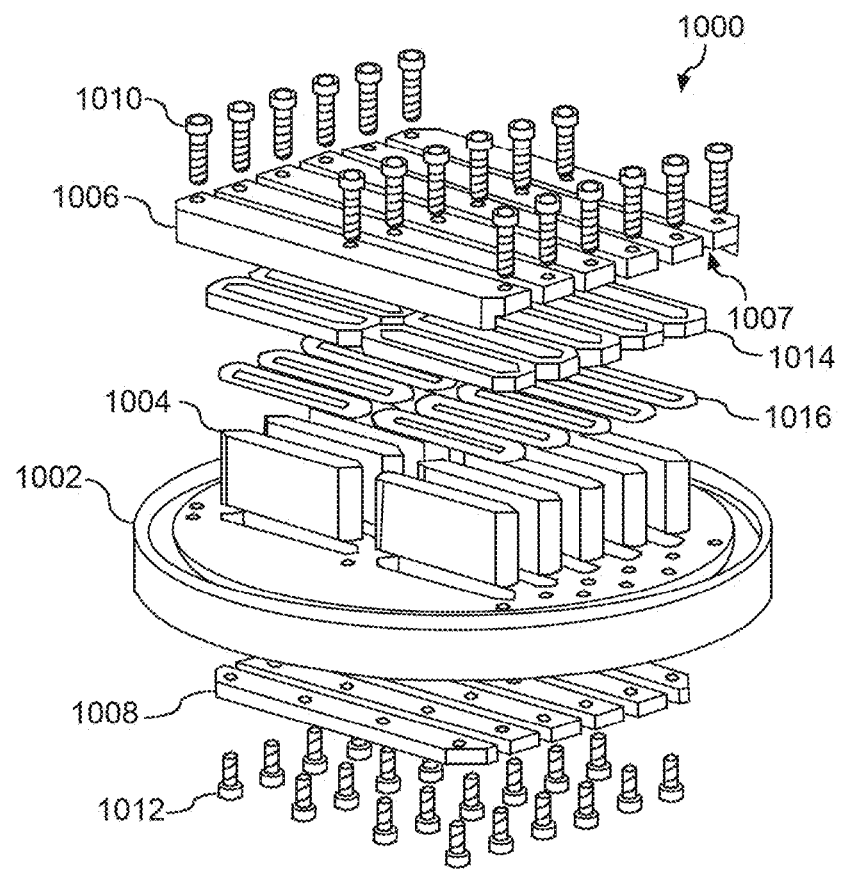
FIG. 10A depicts an example hermetic seal according to example embodiments of the present disclosure.
Figure 10B:
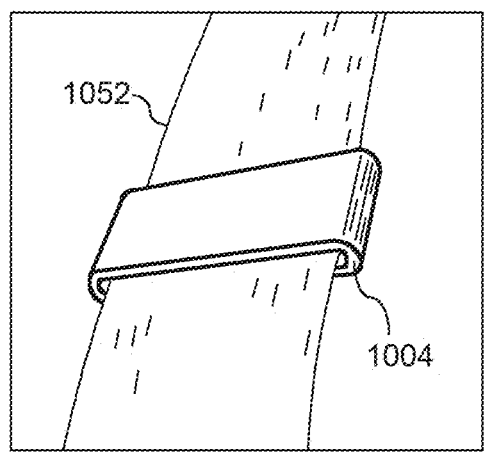
FIG. 10B depicts an example fitted seal assembly according to example embodiments of the present disclosure.

The first flex circuit board(s) 314 can pass through a hermetic seal 352 positioned at an end (e.g., an entrance) of the vacuum chamber, such as cap 307. For example, a flex circuit board (e.g., first flex circuit board 314) can be configured to pass through the hermetic seal 352 such that a first portion of the flex circuit board (e.g., first flex circuit board 314) is disposed in the vacuum chamber and a second portion of the flex circuit board (e.g., first flex circuit board 314) is disposed outside of the vacuum chamber while the hermetic seal 352 forms a vacuum seal for the vacuum chamber. The hermetic seal 352 can provide for the first flex circuit board(s) 314 to enter the vacuum chamber without (e.g., substantially) destroying a vacuum created by the vacuum chamber. As one example, the hermetic seal 352 can include a fitted seal for each first flex circuit board 314. The fitted seal(s) can receive the first flex circuit board(s) 314 and form a vacuum seal with surface(s) of the first flex circuit board(s) 314. Additionally, the hermetic seal 352 can include one or more seal slots configured to receive the fitted seal(s) and/or the first flex circuit board(s) 314. For example, the fitted seal(s) can form a vacuum seal with the seal slot(s) while allowing the first flex circuit board(s) 314 to pass through the seal slot(s) and into the vacuum chamber. In this way, the flex circuit board(s) 306 can enter the vacuum chamber without experiencing signal disruptions from breaks in the circuit boards, as the boards can continuously pass into the vacuum chamber. In some embodiments, the hermetic seal 352 can include fastening systems to secure the fitted seals to the seal slots and/or form a vacuum seal, such as, for example, screws, bolts, seal rings, O rings, etc. In some embodiments, the hermetic seal 352 can form a vacuum seal without requiring adhesive material (e.g., glue, resin, etc.) such that, for example, residual adhesive material does not contaminate the flex circuit boards 306. One example hermetic seal that may be employed in accordance with example aspects of the present disclosure is illustrated in FIGS. 10A-10B.

Figure 7:
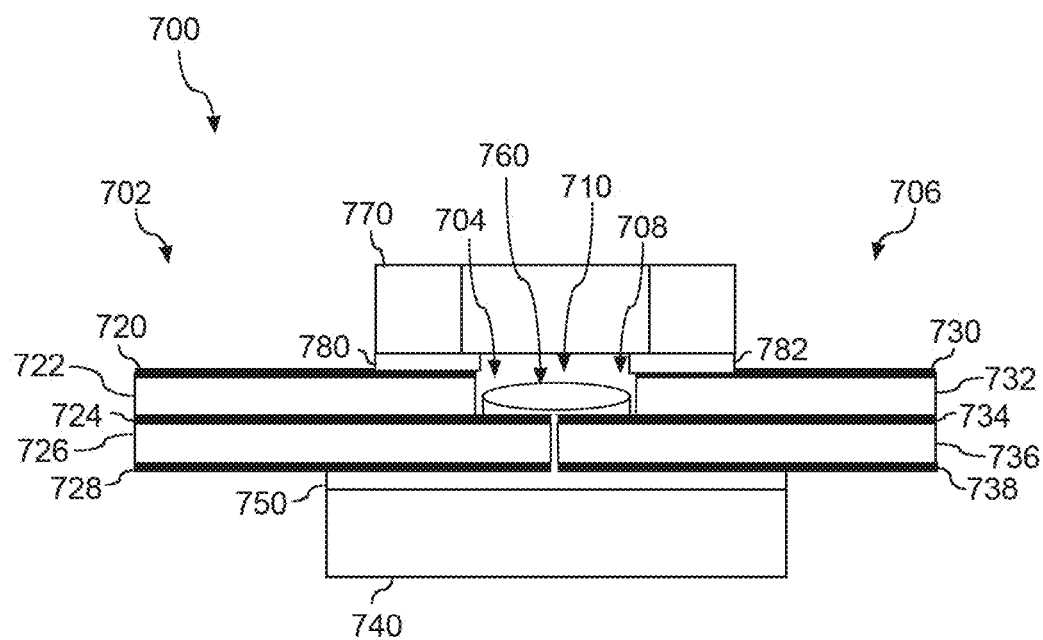
FIG. 7 depicts a cross-sectional view of an example butt joint flex-flex interconnect according to example embodiments of the present disclosure.
Figure 8:
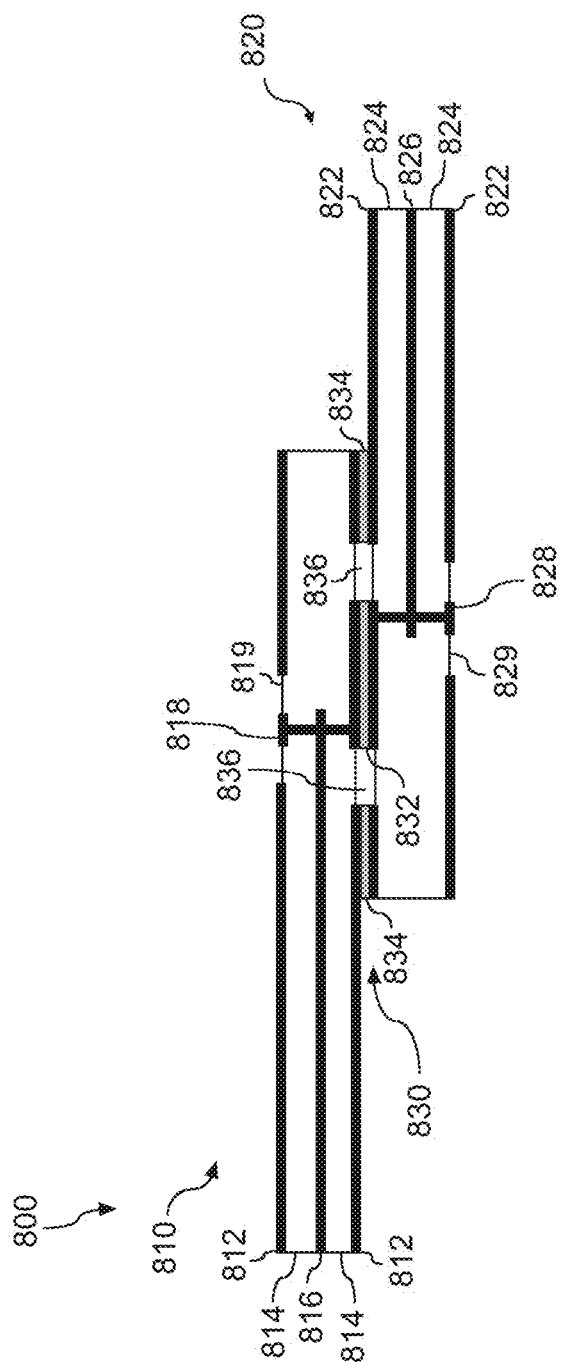
FIG. 8 depicts a cross-sectional view of an example overlap joint flex-flex interconnect according to example embodiments of the present disclosure.

The first flex circuit board(s) 314 can be coupled to at least one second flex circuit board(s) 316. The first flex circuit board(s) 314 can be coupled to the second flex circuit board(s) 316 by at least one flex-flex interconnect 334. For instance, the flex-flex interconnect(s) 334 can couple (structurally and/or electrically) the ground layer(s), dielectric layer(s), and/or signal line(s) of a first flex circuit board 314 to a second flex circuit board 316. As examples, the flex-flex interconnect(s) 334 can be formed by soldering, welding, and/or otherwise fusing components of a first flex circuit board 314 to a second flex circuit board 316. The flex-flex interconnect(s) 334 can be or can include any suitable interconnection of two flex circuit board(s) 306 such as, for example, a butt joint, an overlap joint, and/or any other suitable interconnection(s). For instance, example flex-flex interconnects that may be employed according to example aspects of the present disclosure are illustrated in FIGS. 7-8.

The second flex circuit board(s) 316 can have at least a different material composition from the first flex circuit board(s) 314. In some embodiments, the second flex circuit board(s) 316 can be or can include a second flex circuit board material at the ground layer(s) and/or the signal line(s). The second flex circuit board material can be selected to provide high signal transfer performance characteristics and/or reduced thermal conductivity. As examples, the second flex circuit board material can be or can include a copper alloy and/or other suitable materials having desirable thermal characteristics. For instance, the second flex circuit board(s) 316 can include copper alloy signal lines and/or ground layer(s) to provide reduced thermal conductivity from the upper portions of the vacuum chamber (e.g., first circuit boards 314) and/or dispelling heat produced at subsequent components, such as surface mount attenuators 354.

In some embodiments, the second flex circuit board(s) 316 can be coupled to at least one surface mount attenuator board 318. For instance, the second flex circuit board(s) 316 can be coupled to the surface mount attenuator board(s) 318 by at least one flex-flex interconnect 336. For instance, the flex-flex interconnect(s) 336 can couple (structurally and/or electrically) the ground layer(s), dielectric layer(s), and/or signal line(s) of a second flex circuit board 316 to a surface mount attenuator board 318. As examples, the flex-flex interconnect(s) 336 can be formed by soldering, welding, and/or otherwise fusing components of a second flex circuit board 316 to a surface mount attenuator board 318. The flex-flex interconnect(s) 336 can be or can include any suitable interconnection of two flex circuit board(s) 306 such as, for example, a butt joint, an overlap joint, and/or any other suitable interconnection(s). For instance, example flex-flex interconnects that may be employed according to example aspects of the present disclosure are illustrated in FIGS. 7-8.

The surface mount attenuator board 318 can be a flexible printed circuit board. In some embodiments, the surface mount attenuator board(s) 318 can be or can include a surface mount attenuator board material at the ground layer(s) and/or the signal line(s). The surface mount attenuator board material can be selected to provide high signal transfer performance characteristics. As examples, the surface mount attenuator board material can be or can include copper, brass, gold, and/or other suitable materials having high signal transfer performance characteristics. For instance, the surface mount attenuator board can include copper signal lines and/or ground layer(s) to provide high signal transfer performance characteristics.

Figure 11:
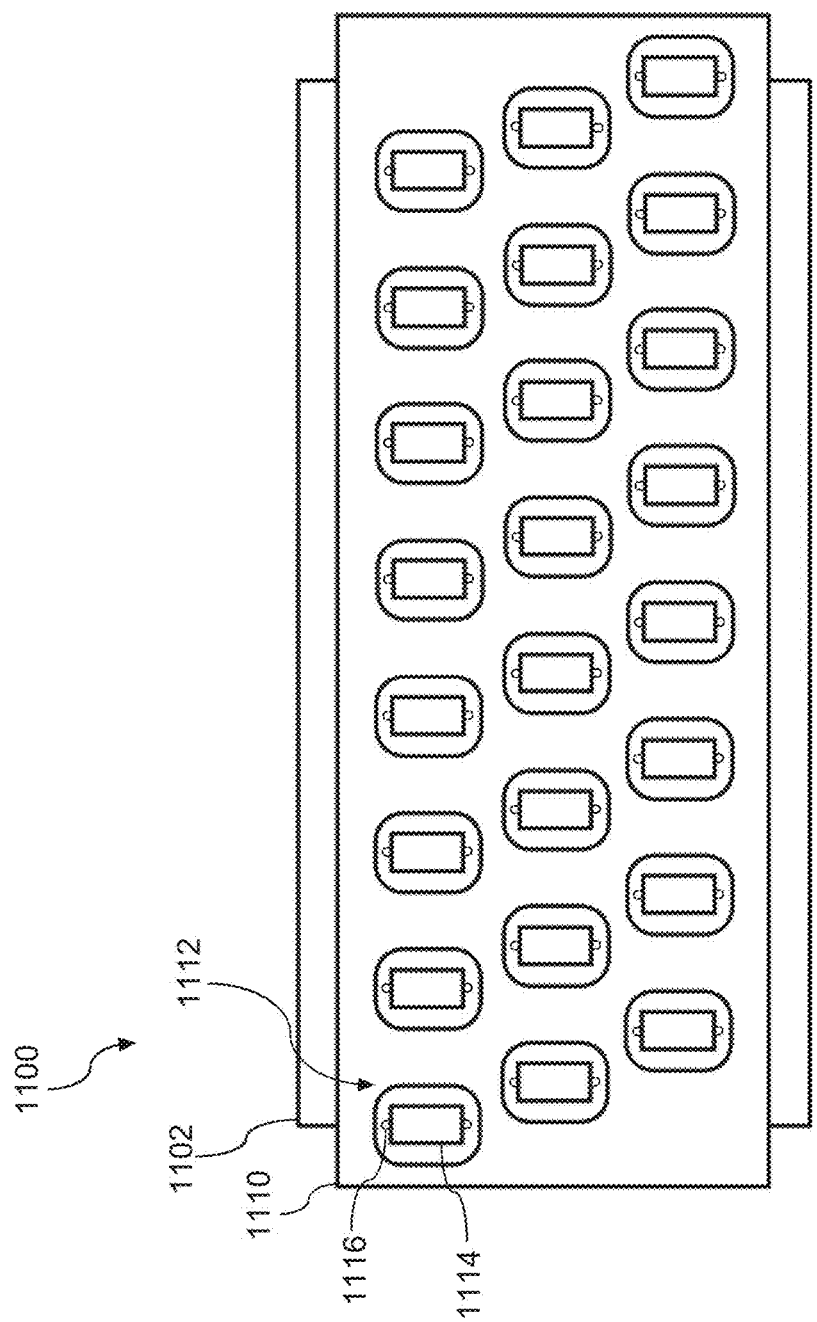
FIG. 11 depicts an example surface mount attenuator board according to example embodiments of the present disclosure.

The surface mount attenuator board(s) 318 can include one or more surface mount attenuators 354. The surface mount attenuator(s) 354 can be configured to attenuate or block thermal photon interference. In some embodiments, the surface mount attenuator board(s) 318 and/or the surface mount attenuator(s) 354 can be placed at a temperature cold enough such that the surface mount attenuator(s) 354 do not produce thermal photons. In some embodiments, the surface mount attenuator(s) 354 can be disposed in an isolation plate. The isolation plate can be configured to isolate the one or more surface mount attenuators. The isolation plate can be attached to the surface mount attenuator board(s) 318. In some embodiments, the isolate plate can be mounted to a ground layer and/or grounded. The isolation plate can include one or more cavities configured to isolate a first surface mount attenuator from a second surface mount attenuator. For example, the cavities can surround the first surface mount attenuator in a direction of a second surface mount attenuator and block cross-talk between attenuators. Example surface mount attenuator board(s) and/or surface mount attenuator(s) that may be employed according to example aspects of the present disclosure are illustrated in FIG. 11.

The quantum computing system 300 can include at least one third flex circuit board 320. For instance, the surface mount attenuator board(s) 318 can be coupled to the third flex circuit board(s) 320 by at least one flex-flex interconnect 338. For instance, the flex-flex interconnect(s) 338 can couple (structurally and/or electrically) the ground layer(s), dielectric layer(s), and/or signal line(s) of a surface mount attenuator board 318 to a third flex circuit board 320. As examples, the flex-flex interconnect(s) 338 can be formed by soldering, welding, and/or otherwise fusing components of a surface mount attenuator board 318 to a third flex circuit board 320. The flex-flex interconnect(s) 338 can be or can include any suitable interconnection of two flex circuit board(s) 306 such as, for example, a butt joint, an overlap joint, and/or any other suitable interconnection(s). For instance, example flex-flex interconnects that may be employed according to example aspects of the present disclosure are illustrated in FIGS. 7-8.

The third flex circuit board(s) 320 can be positioned at a point in the vacuum chamber at which the cooling gradient is cool enough such that some materials exhibit superconductivity. For example, at least a portion of the third flex circuit board(s) 320 can have a temperature of less than about three kelvin.

In some embodiments, the third flex circuit board(s) 320 can be or can include a third flex circuit board material at the ground layer(s) and/or the signal line(s). The third flex circuit board(s) 320 material can be selected to be superconducting at a temperature which at least a portion of the third flex circuit board(s) 320 experiences superconductivity. As examples, the third flex circuit board(s) 320 material can be or can include niobium, tin, aluminum, and/or other suitable superconducting materials. For instance, the third flex circuit board(s) 320 can include copper-plated niobium signal lines and/or ground layer(s) to provide superconductivity. For instance, the copper plating on the copper-plated niobium board(s) can be useful in interfacing with the superconducting niobium, which can provide for improved signal transfer characteristics. In some embodiments, the copper-plated niobium board(s) can be formed by first applying a layer of niobium, followed by a thin layer of copper to prevent the formation of oxides, then a thicker layer of copper.

In some embodiments, the third flex circuit board(s) 320 can be coupled to at least one fourth flex circuit board 322. The third flex circuit board(s) 320 can be coupled to the fourth flex circuit board(s) 322 by at least one flex-flex interconnect 340. For instance, the flex-flex interconnect(s) 340 can couple (structurally and/or electrically) the ground layer(s), dielectric layer(s), and/or signal line(s) of a third flex circuit board 320 to a fourth flex circuit board 322. As examples, the flex-flex interconnect(s) 340 can be formed by soldering, welding, and/or otherwise fusing components of a third flex circuit board 320 to a fourth flex circuit board 322. The flex-flex interconnect(s) 340 can be or can include any suitable interconnection of two flex circuit board(s) 306 such as, for example, a butt joint, an overlap joint, and/or any other suitable interconnection(s). For instance, example flex-flex interconnects that may be employed according to example aspects of the present disclosure are illustrated in FIGS. 7-8.

Figure 9:
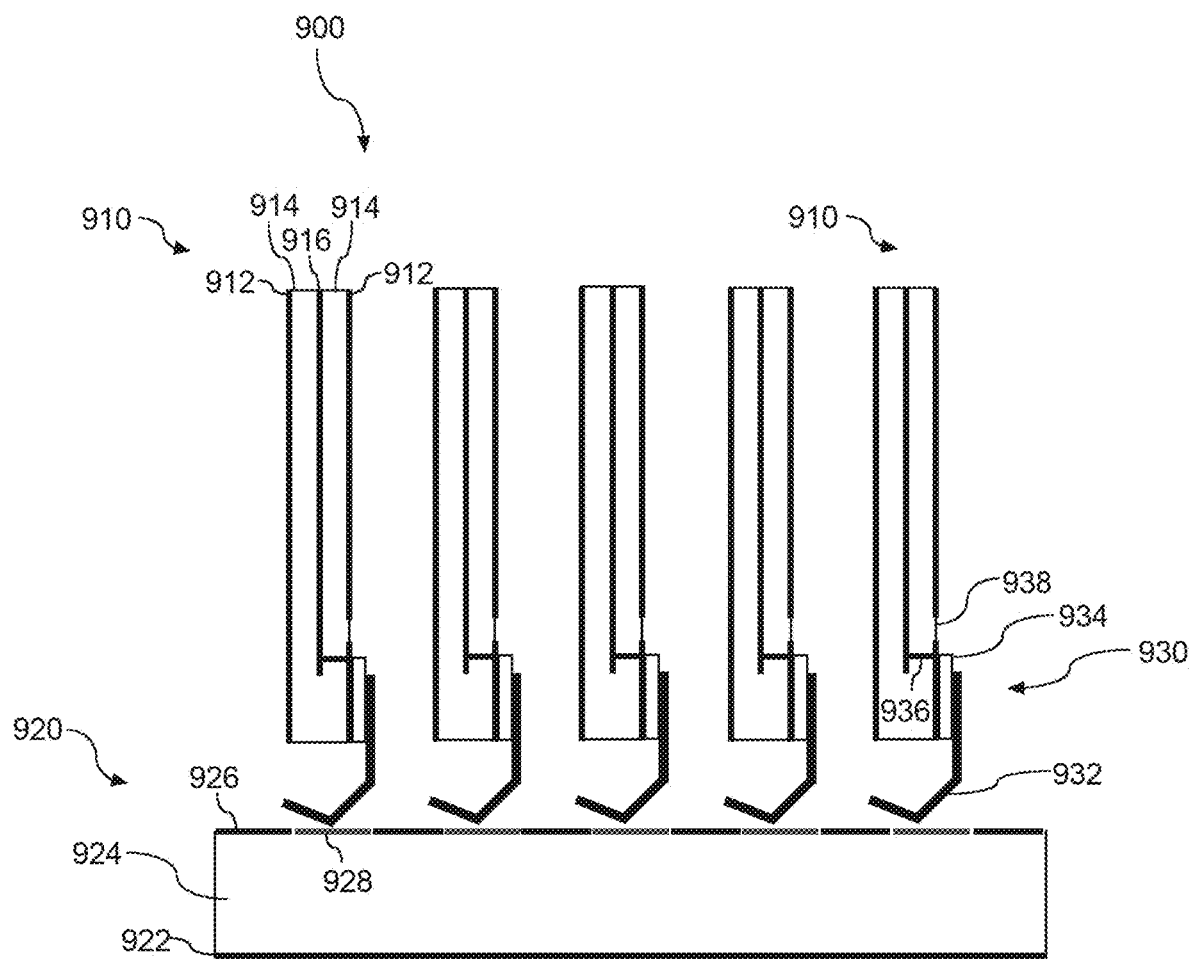
FIG. 9 depicts a cross-sectional view of an example T-joint connector according to example embodiments of the present disclosure.

The fourth flex circuit board(s) 322 can couple the third flex circuit board(s) 320 to the quantum hardware 304. For example, a connector 342 at an end of the fourth flex circuit board(s) 322 can attach to a port that is in signal communication with the quantum hardware 304. As one example, the connector can be a T-joint connector, such as a T-joint connector including superconducting materials (e.g., tin). Additionally and/or alternatively, the connector 342 may be a planar spring array. An example T-joint connector that may be employed in accordance with example aspects of the present disclosure is illustrated in FIG. 9.

In some embodiments, the fourth flex circuit board(s) 322 can be or can include a fourth flex circuit board material at the ground layer(s) and/or the signal line(s). The fourth flex circuit board(s) 322 material can be selected to provide high signal transfer performance characteristics. As examples, the fourth flex circuit board(s) 322 material can be or can include copper, brass, gold, and/or other suitable materials having high signal transfer performance characteristics. For instance, the fourth flex circuit board(s) 322 can include copper signal lines and/or ground layer(s) to provide high signal transfer performance characteristics. Additionally and/or alternatively, the fourth flex circuit board(s) 322 material can be selected to be superconducting at a temperature at which at least a portion of the fourth flex circuit board(s) 322 operates. As examples, the fourth flex circuit board(s) 322 material can be or can include niobium, tin, aluminum, and/or other suitable superconducting materials.

In some embodiments, the fourth flex circuit board(s) 322 can be or can include a filter 356, such as an XYZ and/or IR filter 356. For instance, the filter 356 can be configured to reduce effects of noise, thermal photons, and/or other potential sources of interference. As one example, the filter 356 can include a cavity in the fourth flex circuit board(s) 322 that is filled with a filter material, such as a particulate suspension, to provide XYZ/IR filtering. In some examples, the filter material can provide less attenuation to signals of a first frequency and greater attenuation to signals of a second, higher frequency. For instance, some filter materials provide attenuation that increases in a substantially monotonic fashion with increasing signal frequency for at least a portion of a targeted frequency band. In some embodiments, aspects of the filter material can be configured for lowpass and/or bandpass operation.

In some embodiments, the filter 356 can be bounded by one or more boundaries of a cavity within the fourth flex circuit board(s) 322 (e.g., a cavity within the dielectric material). For instance, a cavity within the fourth flex circuit board(s) 322 can be filled with a filter material (e.g., a magnetically loaded polymer). In some embodiments, the cavity can be filled (e.g., partially or completely) with filter material via an access within the fourth flex circuit board(s) 322 when the filter material is in any pourable, injectable, and/or moldable state (e.g., flowing particulates, soft/plasticized materials, gels, slurries, pastes, foams, uncured thermosets, softened/melted thermoplastics, etc.). In some embodiments, the cavity can be filled with the filter material in a substantially solid state (e.g., by press-fitting into the cavity, etc.).

FIG. 4 depicts a cross-sectional view of an example flex circuit board 400 according to example embodiments of the present disclosure. The flex circuit board 400 can include one or more signal lines 406. The flex circuit board 400 can be configured to transmit signals by the one or more signal lines 406, such as through a vacuum chamber to couple one or more classical processors to quantum hardware. The flex circuit board 400 can include a plurality of signal lines 406 and can provide a significantly improved signal line density, in addition to providing improved isolation, reduced thermal conductivity, and/or improved scalability. For instance, including flex circuit board(s) 400 according to example aspects of the present disclosure to couple classical processors to quantum hardware can provide for infrastructure that reliably scales to the increasingly greater numbers of qubits that are achieved and/or expected in contemporary and/or future quantum computing systems.

As used herein, a "flex circuit board" refers to a board including at least one generally planar substrate (e.g., layered substrates) or other support on which the one or more signal lines 406 are formed or otherwise disposed and having flexibility in at least one plane. As used herein, "flexibility" refers to a capability of deforming (e.g., subject to mechanical stress, etc.) without breaking. For example, a rectangular flex circuit board 400 may be flexible along a largest surface of the rectangular flex circuit board 400. A rectangular flex circuit board 400 may be flexible and/or rigid along at least a portion of its edges. The flexibility may be achieved as a property of material(s) from which the flex circuit board 400 and/or layers of the flex circuit board 400 is/are formed (e.g., metals, such as copper, copper alloys, niobium, aluminum, etc., dielectric materials, nonmetals, polymers, rubbers, etc.), achieved by hinging and/or segmenting of the flex circuit board 400 (e.g., hinging and/or segmenting a rigid portion), and/or in any other suitable manner. The substrate(s) may be strictly planar (e.g., having a substantially linear cross-section across a length and width) and/or may be generally planar in that the substrate(s) bend, wrinkle, or are otherwise non-linear in at least one cross-section but generally represent a shape having a depth significantly less than (e.g., less than about 10% of) a length and width.

In some embodiments, the flex circuit board 400 can include at least one ground layer 402. The ground layer 402 can form an outer surface of the flex circuit board 400, such as an outer surface along the largest surface. In some embodiments, the flex circuit board 400 can include two ground layers 402, such as two parallel and spaced apart ground layers 402. For instance, the two ground layers 402 can form both largest outer surfaces of the flex circuit board 400. A ground layer 402 can act as an electrical isolation layer to isolate signal lines 406 on one side of the ground layer 402 from interfering signals (e.g., from signal lines 406 on other layers, other boards, the environment, etc.) on another side of the ground layer 402. For instance, the ground layer 402 can be coupled to earth ground and/or other suitable ground(s).

The ground layer(s) 402 can be or can include any suitable electrically conductive material. In some embodiments, the ground layer(s) 402 can be or can include superconducting ground layer(s) 402 including superconducting material(s), such as superconducting material(s) that achieve(s) superconductivity at a temperature less than about 3 kelvin, such as about 1 kelvin, such as about 20 millikelvin. As examples, the ground layer(s) 402 can be or can include niobium, tin, aluminum, molybdenum disulfide, BSCCO, and/or other suitable superconducting materials. Additionally and/or alternatively, the ground layer(s) 402 can be or can include material having high signal transfer performance characteristics, such as low resistance, low reflectivity, low distortion, etc. such that a signal is substantially unchanged by passing through the signal line. As examples, the ground layer(s) 402 can be or can include copper, gold, and/or other suitable materials having high signal transfer performance characteristics. Additionally and/or alternatively, the ground layer(s) 402 can be or can include material(s) having desirable thermal characteristics, such as suitably high and/or low thermal transfer, such as, for example, copper, copper alloy, etc.

In some embodiments, the flex circuit board 400 can include at least one dielectric layer 404. The dielectric layer(s) 404 can be or can include any suitable dielectric material, such as dielectric polymers. In some embodiments, the dielectric layer(s) 404 can be or can include flexible dielectric material. As one example, the dielectric layer(s) 404 can be or can include polyimide. At least a portion of the dielectric layer(s) 404 can be formed on or otherwise disposed proximate to at least a portion of an inner surface of the ground layer(s) 402. For example, in some embodiments, an inner surface of a ground layer 402 can be mated with an outer surface of a dielectric layer 404. Furthermore, in some embodiments, inner surfaces of two dielectric layers 404 can be mated with signal lines 406 disposed therebetween.

The flex circuit board 400 can include one or more signal lines 406. The one or more signal lines 406 can be disposed on a surface (e.g., an inner surface) of at least one dielectric layer 404. As an example, in some implementations, the one or more signal lines 406 can be disposed between opposing inner surfaces of two dielectric layers 404. The signal line(s) 406 can be or can include any suitable electrically conductive material. In some embodiments, the signal line(s) 406 can be or can include superconducting signal line(s) 406 including superconducting material(s), such as superconducting material(s) that achieve(s) superconductivity at a temperature less than about 3 kelvin, such as about 1 kelvin, such as about 20 millikelvin. As examples, the signal line(s) 406 can be or can include niobium, tin, aluminum, molybdenum disulfide, BSCCO, and/or other suitable superconducting materials. Additionally and/or alternatively, the signal line(s) 406 can be or can include material having high signal transfer performance characteristics. As examples, the signal line(s) 406 can be or can include copper, gold, and/or other suitable materials having suitably high and/or low signal transfer performance characteristics. Additionally and/or alternatively, the signal line(s) 406 can be or can include material(s) having desirable thermal characteristics, such as, for example, copper, copper alloy, etc.

FIG. 5 depicts a cross-sectional view of an example flex circuit board 500 according to example embodiments of the present disclosure. The flex circuit board 500 can include various components discussed with reference to flex circuit board 400 of FIG. 4, such as, for example, ground layer(s) 402, dielectric layer(s) 404, and/or signal line(s) 406. Additionally, the flex circuit board 500 can include one or more vias 502. For instance, the via(s) 502 can extend through the ground layer(s) 402, the dielectric layer(s) 404, and/or the signal line(s) 406. The via(s) 502 can serve to improve isolation of the signal lines 406. Additionally and/or alternatively, the via(s) 502 can serve to couple multiple ground layers 402 and/or transfer signals between layers (e.g., 402, 404, 406) of the flex circuit board 500. In some embodiments, the via(s) 502 can be plated with via plate(s) 504 that extend along the via(s) 502. The via plate(s) 504 can be any suitable material. For instance, in some embodiments, the via plate(s) 504 can be or can include conductive material, such as copper.

FIG. 6 depicts a cross-sectional view of an example flex circuit board 600 according to example embodiments of the present disclosure. The flex circuit board 600 can include various components discussed with reference to flex circuit board 400 of FIG. 4, such as, for example, ground layer(s) 402, dielectric layer(s) 404, and/or signal line(s) 406. Additionally, the flex circuit board 600 can include interconnect pads 602. The interconnect pads 602 can couple to conductive material on flex circuit board 600, such as the ground layer(s) 402 and/or signal line(s) 406. Additionally and/or alternatively, via(s) 604 in flex circuit board 600 can be plated with via plate(s) 606. The via plate(s) 606 may be formed of a same material and/or formed concurrently with interconnect pads 602.

In some embodiments, the ground layer(s) 402 and/or signal line(s) 406 can be superconducting material and the interconnect pads 602 can be material such as copper to provide improved interfacing with the superconducting ground layer(s) 402 and/or superconducting signal line(s) 406. For instance, this can resolve some difficulties associated with interfacing with and/or between superconducting materials. In some embodiments, adhesion layers (not illustrated) can be included between the interconnect pads 602 and the conductive material (e.g., the ground layer(s) 402 and/or the signal line(s) 406). In some embodiments, the adhesion layer(s) can be a material that may be different from the material of the ground layer(s) 402 and/or signal line(s) 406 and/or the interconnect pads 602, such as titanium. In some embodiments, the interconnect pads 602 can be formed of deposited copper, then electroplated copper. The interconnect pads 602 may be deposited in a vacuum to prevent contamination of interfaces between the interconnect pads 602 and the flex circuit board 600.

FIG. 7 depicts a cross-sectional view of an example butt joint flex-flex interconnect 700 according to example embodiments of the present disclosure. In an example, flex circuit butt joint 700 includes a first flex circuit board 702, a second flex circuit board 706, a ground support layer 740, a solder connection 750, a solder bridge 760, an isolation plate 770, solder connection 780, and solder connection 782.

First flex circuit board 702 includes a removed portion 704, ground plane 720, dielectric layer 722, signal line(s) 724, dielectric layer 726, and ground plane 728. In an example, removed portion 704 of first flex circuit board 702 exposes some or all of signal line(s) 724. In some examples, removed portion 704 is a pocket etched or otherwise created on an edge or a side of first flex circuit board 702, which exposes signal line(s) 724 to be butt-connected with signal lines of another board (e.g., exposed signal line(s) 734 of second flex circuit board 706).

Second flex circuit board 706 includes a removed portion 708, ground plane 730, dielectric layer 732, signal line(s) 734, dielectric layer 736, and ground plane 738. In an example, removed portion 708 of first flex circuit board 702 exposes some or all of signal line(s) 734. In some examples, removed portion 708 is a pocket etched or otherwise created on an edge or a side of second flex circuit board 706, which exposes signal line(s) 734 to be butt-connected, for example, with signal line(s) 724 of first flex circuit board 702 or another board.

In an example, first flex circuit board 702 and second flex circuit board 706 are aligned such that removed portion 704 of first flex circuit board 702 and removed portion 708 of second flex circuit board 706 are positioned towards or facing one another. For example, first flex circuit board 702 and second flex circuit board 706 may be substantially aligned in a manner where removed portion 704 and removed portion 708 form a signal trace gap 710.

In an example, signal trace gap 710 generally describes an area of physical space where signal line(s) 724 are exposed in relation to removed portion 704 of first flex circuit board 702 and signal line(s) 734 are exposed in relation to removed portion 708 of second flex circuit board 706. As such, signal trace gap 710 generally may be an area formed when removed portion 704 of first flex circuit board 702 and removed portion 708 of second flex circuit board 706 are positioned in relative proximity to one another.

In an example, a side or an edge of first flex circuit board 702 corresponding to removed portion 704 is aligned in proximity with a side or an edge of second flex circuit board 706 corresponding to removed portion 708. In some examples, removed portion 704 of first flex circuit board 702 and removed portion 708 of second flex circuit board 706 may be positioned such that first flex circuit board 702 and second flex circuit board 706 touch or are in contact with one another near signal trace gap 710. In some examples, first flex circuit board 702 and second flex circuit board 706 may not touch, but instead may remain in relative or close proximity to one another. In some examples, one or more exposed signal line(s) 724 touch or are in contact with one or more exposed signal line(s) 734 near signal trace gap 710, for example, when first flex circuit board 702 and second flex circuit board 706 touch or are in contact.

In an example, solder bridge 760 connects one or more exposed signal line(s) 724 with one or more exposed signal line(s) 734 near signal trace gap 710. For example, solder bridge 760 may connect exposed signal line(s) 724 either that are in contact or not in contact with exposed signal line(s) 734, and either when first flex circuit board 702 and second flex circuit board 706 touch or do not touch. Solder bridge 760 generally may be any type of connective substance or layer, for example, such as a solder bridge or connective material that joins different objects or elements together.

In an example, solder bridge 760 includes one or more conductive materials that allow current, pulses, signals, and/or other types of communication to pass or travel across or through signal line(s) 724 and signal line(s) 734, or vice versa. In some examples, solder bridge 760 may be formed of one or more conductive metals including, but not limited to, silver, copper, gold, aluminum, etc. In some examples, solder bridge 760 may be formed of one or more superconductive materials that become superconducting under certain conditions, for example, such as at a temperature less than about 3 kelvin, such as about 1 kelvin, such as about 20 millikelvin. In some examples, solder bridge 760 may include one or more conductive adhesives, for example, in addition to or instead of solder material. Conductive adhesives generally may include electrically conductive adhesives, pastes, or glues. Such conductive adhesives may include one or more conductive materials and/or one or more materials that become superconducting under certain conditions.

Ground support layer 740 is coupled to ground plane 728 of first flex circuit board 702 and to ground plane 738 of second flex circuit board 706 via solder connection 750. In an example, ground support layer 740 extends at least partially across first flex circuit board 702 and also at least partially across second flex circuit board 706. Ground support layer 740 may be coupled to an external portion of first flex circuit board 702 and to an external portion of second flex circuit board 706, for example, to join and provide support for adjoined flex circuit boards. In an example, solder connection 750 may be one or more solder or adhesive connections coupling ground support layer 740 to first flex circuit board 702 and to second flex circuit board 706.

Isolation plate 770 is coupled to ground plane 720 of first flex circuit board 702 via solder connection 780 and to ground plane 730 of second flex circuit board 706 via solder connection 782. In an example, isolation plate 770 extends at least partially across first flex circuit board 702 and at least partially across second flex circuit board 706, covering signal trace gap 710 on a side opposite of ground support layer 740. In some examples, isolation plate 770 covers signal trace gap 710, signal line(s) 724 near removed portion 704 of first flex circuit board 702, solder bridge 760 (when present), and signal line(s) 734 near removed portion 708 of second flex circuit board 706. In some examples, isolation plate 770 may be coupled to one or both of first flex circuit board 702 and/or second flex circuit board 706. Also, flex circuit butt joint 700 may include isolation plate 770 with or without use of ground support layer 740.

In an example, flex circuit butt joint 700 may be configured, for example, without ground support layer 740 and without isolation plate 770, with at least one of ground support layer 740 or isolation plate 770, or with both ground support layer 740 and isolation plate 770. In some examples, one or more of ground support layer 740 and/or isolation plate 770 may be formed of copper. In some examples, isolation plate 770 may have one or more holes that are cut out before, during, and/or after circuit board coupling, for example, to provide access to signal line(s) 724, 734 near signal trace gap 710.

In some examples, flex circuit butt joint 700 is used to join two separate flex circuit boards together. In some examples, flex circuit butt joint 700 may join one flex circuit board with another type of circuit board, such as a rigid circuit board. In addition, examples of the present disclosure may be used to join any two separate flexible or rigid circuit boards together. Various examples of flex circuit butt joint 700 may be used to connect different flex and other types of circuit boards used in quantum computing systems, classical computing systems, and/or in conjunction with both quantum and classical computing systems, such as interconnects used to join quantum and classical computing systems for operation together. In various examples, any number of flex circuit boards and/or other types of boards each may be joined or chained together, for example, consecutively one after another using multiple different flex circuit butt joint 700 interconnections. For example, second flex circuit board 706 could be joined with a third circuit board (not shown) via a flex circuit butt joint, which could be joined with a fourth circuit board (also not shown) via another flex circuit butt joint, etc.

FIG. 8 depicts a cross-sectional view of an example overlap joint flex-flex interconnect 800 according to example embodiments of the present disclosure. The overlap joint flex-flex interconnect 800 can be used for interconnecting multiple flex circuit boards. The overlap joint flex-flex interconnect 800 can be made between a first flex circuit board 810 and a second flex circuit board 820. The first flex circuit board 810 can include ground layer(s) 812, dielectric layer(s) 814, and/or signal line(s) 816. Similarly, the second flex circuit board 820 can include ground layer(s) 822, dielectric layer(s) 824, and/or signal line(s) 826. The first flex circuit board 810 and the second flex circuit board 820 may include the same materials and/or different materials.

The first flex circuit board 810 can include at least one via 818 extending through the dielectric layer 814 from the signal line 816 to a second side of the first flex circuit board (e.g., a side having the ground layer 812). For example, the via 818 can be a same material as the signal line 816 (e.g., superconducting material) and/or may be different material. The via 818 can be surrounded by gap 819. For example, gap 819 may be circular on a surface having the ground layer 812. In some embodiments, such as illustrated in FIG. 8, the via 818 can extend through both dielectric layers 814. For example, the via 818 can be a so-called "through via" that extends from a first surface of the first flex circuit board 810 to a second surface of the first flex circuit board 810. Additionally and/or alternatively, the via 818 can be a so-called "blind via" that extends from the signal line 816 to only one side of the first flex circuit board 810 (e.g., to signal pad 832).

The second flex circuit board 820 can additionally include at least one via 828 extending through the dielectric layer 824 from the signal line 826 to a second side of the second flex circuit board (e.g., a side having the ground layer 822). For example, the via 828 can be a same material as the signal line 826 (e.g., superconducting material) and/or may be different material. The via 828 can be surrounded by gap 829. For example, gap 829 may be circular on a surface having the ground layer 822. In some embodiments, the via 828 can extend through both dielectric layers 824. In some embodiments, such as illustrated in FIG. 8, the via 828 can extend through both dielectric layers 824. For example, the via 828 can be a so-called "through via" that extends from a first surface of the second flex circuit board 820 to a second surface of the second flex circuit board 820. Additionally and/or alternatively, the via 828 can be a so-called "blind via" that extends from the signal line 826 to only one side of the second flex circuit board 820 (e.g., to signal pad 832).

The overlap joint flex-flex interconnect 800 can include overlap joint 830. For instance, overlap joint 830 can be formed at an overlap of first flex circuit board 810 and second flex circuit board 820. The overlap joint 830 can include at least signal pad 832. Signal pad 832 can be configured to couple signal line 816 (e.g., by via 818) of the first flex circuit board 810 to signal line 826 (e.g., by via 828) of the second flex circuit board 820. The signal pad 832 can facilitate signal transfer between the first flex circuit board 810 and the second flex circuit board 820. Additionally, the overlap joint 830 can include one or more ground pads 834. A ground pad 834 can couple a ground layer 812 of the first flex circuit board 810 to a mated ground layer 822 of the second flex circuit board 822. For example, the ground pad 834 can place the ground layers 812 and 822 in electrical communication. One or more gaps 836 can be provided between the signal pad 832 and the ground pad(s) 834 to isolate the signal pad 832 from the ground pad(s) 834. In some embodiments, the signal pad 832, ground pad 834, and/or gaps 836 can be designed for impedance matching for transmitted signals. For instance, the signal pad 832 and/or the ground pad(s) 834 can be formed of solder, solder pads, solder paste, etc.

FIG. 9 depicts a cross-sectional view of an example T-joint connector 900 according to example embodiments of the present disclosure. The T-joint connector 900 can be configured to couple one or more flex circuit boards 910 to a mounting circuit board 920. For instance, the T-joint connector 900 can be configured to connect multiple flex circuit boards 910 perpendicularly to a single mounting circuit board 920. This can provide for a high-density interconnect suitable for connecting large numbers of signal lines (e.g., from multiple boards) to a single board having relatively high signal line density while maintaining desirable signal transmission characteristics.

The flex circuit board(s) 910 may each include at least one ground layer 912, at least one dielectric layer 914, and/or one or more signal lines 916. For example, the flex circuit board(s) 910 may be flex circuit boards such as any of flex circuit boards 400, 500, 600 of FIGS. 4-6. In some embodiments, the ground layer(s) 912 and/or the signal line(s) 916 may be or include superconducting material at a temperature less than about 3 kelvin, such as about 1 kelvin, such as about 20 millikelvin, such as aluminum, tin, etc.

The mounting circuit board 920 may be a flex circuit board as described herein (e.g., formed of one or more flexible substrates) and/or may be a rigid circuit board. The mounting circuit board 920 can include at least a ground layer 922 and a dielectric layer 924. The ground layer 922 and/or the dielectric layer 924 may be flexible and/or rigid. Additionally, a surface of the mounting circuit board 920 opposite the ground layer 922 can include one or more ground pads 926 and/or one or more signal pads 928. For example, the surface opposite the ground layer 922 can include a two-dimensional array of signal pads 928. Ground pads 926 may be arranged to provide isolation between the signal pads 928. For instance, the ground pads 926 may be arranged in spaces between the two-dimensional array of signal pads 928.

The T-joint connector can include one or more spring interconnects 930. The spring interconnect(s) 930 can be disposed on a surface of the flex circuit boards 910. The spring interconnect(s) 930 can couple to the signal line(s) 916 and/or be in electrical communication (e.g., signal communication) with the one or more signal line(s) 916. FIG. 9 depicts a cross-section of the T-joint connector 900, illustrating only one spring interconnect 930 per flex circuit board 910. It should be understood that, in some embodiments, a plurality of spring interconnects 930 can be spaced across a surface of the flex circuit board 910. For example, a line of spring interconnects 930 can couple to a corresponding line of signal pads 928 in a two-dimensional array of signal pads 928.

Each of the spring interconnect(s) 930 can include a spring element 932. In some embodiments, the spring element 932 can be attached to the flex circuit board 910 by a signal pad 934, such as a solder pad. The signal pad 934 can provide signal communications with the spring element 932. A via 936 can extend from signal line 916 to the signal pad 934 and/or the spring element 932. For example, the via 936 can provide signal communications between the signal line 916 and the spring element 932. In some embodiments, a gap 938 can be provided between the signal pad 934 and the ground layer 912 to isolate the ground layer 912 from the signal pad 934 and/or the spring element 932.

In some embodiments, the spring element 932 can include superconducting material at a temperature less than about 3 kelvin, such as about 1 kelvin, such as about 20 millikelvin. For example, in some embodiments, the spring element 932 can be formed of superconducting material. Additionally and/or alternatively, in some embodiments, the spring element 932 can include a coating of superconducting material, such as tin. For example, the spring element 932 may be formed of non-superconducting material (e.g., beryllium) and coated with superconducting material (e.g., tin). In this way, the spring element 932 can properly function as a spring using a material that has desirable mechanical properties (e.g., elasticity, tension, etc.) that may not be superconducting, while the superconducting coating can provide superconductivity, as the coating can be sufficient to provide superconductivity properties at the spring interconnect 930.

In some embodiments, the T-joint connector 900 can include one or more grounding boards (not illustrated) between the flex circuit boards 910. The grounding boards can isolate a first flex circuit board 910 from a second flex circuit board 910 and/or isolate a flex circuit board 910 from external interference. Additionally and/or alternatively, a grounding board may be included between the flex circuit board(s) 910 and the mounting board 920. The grounding board(s) may contact the mounting board 920 (e.g., ground pads 928) and/or another suitable ground such that the grounding board(s) are grounded.

In some embodiments, the T-joint connector 900 may be self-aligned. For example, various aligning systems such as shims, tabs, connector hardware, etc. may be used to align the flex circuit board(s) 910 to the mounting circuit board 920 and/or to align the spring elements 932 to the signal pads 928. As one example, the flex circuit board(s) 910 and/or spring interconnect(s) 930 may be disposed in connector hardware configured to align the T-joint connector 900 to a mating interface on the mounting circuit board 920.

FIG. 10A depicts an example hermetic seal 1000 according to example embodiments of the present disclosure. Hermetic seal 1000 can be configured to receive at least one flex circuit board to admit a portion of the flex circuit board into a vacuum chamber. For example, the hermetic seal 1000 may be positioned at an end (e.g., an entrance) of the vacuum chamber, such as a cap of a chamber mount. A flex circuit board can be configured to pass through the hermetic seal 1000 such that a first portion of the flex circuit board is disposed in the vacuum chamber and a second portion of the flex circuit board is disposed outside of the vacuum chamber while the hermetic seal 1000 forms a vacuum seal for the vacuum chamber. The hermetic seal 1000 can provide for the flex circuit board(s) to enter the vacuum chamber without (e.g., substantially) destroying a vacuum created by the vacuum chamber.

As one example, the hermetic seal 1000 can include a hermetic seal base 1002. The hermetic seal base 1002 can be attached to a chamber mount, such as a cap of a chamber mount. In some embodiments, the hermetic seal base 1002 may be formed continuously with the chamber mount. The hermetic seal base 1002 can include slots configured to receive various components of the hermetic seal 1000, such as, for example, fitted seal(s) 1004, screws 1010, and/or screws 1012.

The hermetic seal 1000 can include one or more fitted seal(s) 1004. For instance, hermetic seal 1000 can include a fitted seal 1004 for each flex circuit board. The fitted seal(s) 1004 can receive a flex circuit board and form a vacuum seal with surface(s) of the flex circuit board. This is discussed further with reference to FIG. 10B. Additionally, the hermetic seal 1000 can include one or more seal slots configured to receive the fitted seal(s) 1004 and/or the flex circuit board(s). For example, the fitted seal(s) 1004 can form a vacuum seal with the seal slot(s) while allowing the flex circuit board(s) to pass through the seal slot(s) and the hermetic seal 1000 (e.g., into the vacuum chamber). In this way, the flex circuit board(s) can pass through the hermetic seal 1000 (e.g., enter the vacuum chamber) without experiencing signal disruptions from breaks in the circuit boards, as the boards can continuously pass through the hermetic seal 1000 (e.g., into the vacuum chamber).

The hermetic seal 1000 can include various fastening elements to secure the fitted seals 1004 to the hermetic seal base 1002 (e.g., the seal slots) and/or to form a vacuum seal with the hermetic seal base 1002. For example, the hermetic seal 1000 can include first side supports 1006. The first side supports 1006 can be attached to a first side of the hermetic seal base 1002, such as a side receiving the fitted seal(s) 1004. For instance, the first side supports 1006 can be attached to hermetic seal base 1002 by screws 1010. The first side supports 1006 can secure the fitted seal(s) 1004 to the hermetic seal base 1002. Additionally and/or alternatively, the first side supports 1006 can secure seal ring 1014 and/or seal ring cap 1016 to fitted seal 1004 to assist in forming a vacuum seal between fitted seal 1004 and first side supports 1006. Slots 1007 in the first side supports 1006 can allow for a flex circuit board to pass through the hermetic seal 1000.

Additionally and/or alternatively, the hermetic seal 1000 can include second side supports 1008. The second side supports 1008 can be attached to a second side of hermetic seal base 1002, such as a side on an inner surface of a vacuum chamber. For instance, the second side supports 1008 can be attached to hermetic seal base 1002 by screws 1012. The second side supports 1008 can additionally secure the fitted seal(s) 1004 to the hermetic seal base 1002 and/or assist in forming a vacuum seal between fitted seal(s) 1004 and hermetic seal base 1002. Additionally and/or alternatively, slots in the second side supports 1008 can allow for a flex circuit board to pass through the hermetic seal 1000.

FIG. 10B depicts an example fitted seal assembly 1050 according to example embodiments of the present disclosure. As illustrated in FIG. 10B, a fitted seal 1004 can receive a flex circuit board 1052 and form a vacuum seal with surface(s) of the flex circuit board 1052. This can additionally provide for individual removal of the flex circuit board 1052 from hermetic seal 1000, as a single fitted seal 1004 and flex circuit board 1052 can be removed from a slot.

In some embodiments, the fitted seal 1004 can be adhesiveless. For instance, the fitted seal 1004 can form a vacuum seal with the flex circuit board 1052 without the assistance of adhesives, such as glue, resins, sealant, etc. For example, the fitted seal 1004 may include a rigid outer shell and an inner surface of the outer shell may include an epoxy seal. This may provide for advantages such as, for example, easier removal of flex circuit board 1052 from hermetic seal 1000 and/or reduction of adhesive build-up on flex circuit board 1052. In some embodiments, the fitted seal 1004 can form a vacuum seal even in the absence of flex circuit board 1052. Additionally and/or alternatively, the fitted seal 1004 may be replaced by another seal in the absence of a flex circuit board 1052 such that not every slot in the hermetic seal 1000 must receive a flex circuit board 1052 to form a vacuum seal.

FIG. 11 depicts an example surface mount attenuator board 1100 according to example embodiments of the present disclosure. For instance, the surface mount attenuator board 1100 can include a flex circuit board 1102. In some embodiments, one or more additional flex circuit board(s) can be coupled to the surface mount attenuator board 1100 (e.g., to flex circuit board 1102). In some embodiments, the surface mount attenuator board 1100 and/or the surface mount attenuator(s) 1114 can be placed at a temperature cold enough such that the surface mount attenuator(s) do not produce thermal photons.

The surface mount attenuator board 1100 can include one or more surface mount attenuators 1114. The surface mount attenuator(s) 1114 can be configured to attenuate or block signal components at the surface mount attenuators, such as from thermal photon interference. For example, the surface mount attenuators 1114 can be coupled to signal lines at surface mount attenuator board 1100, such as signal lines of flex circuit board 1102. As one example, vias 1116 can extend through the surface mount attenuator board 1100 (e.g., a ground layer of flex circuit board 1102) to couple the surface mount attenuators to signal lines inside flex circuit board 1102.

The surface mount attenuator(s) 1114 can be disposed in an isolation plate 1110. For example, the isolation plate 1110 can be attached to the surface mount attenuator board 1100, such as to the flex circuit board 1102. In some embodiments, the isolate plate 1110 can be mounted to a ground layer of flex circuit board 1102 and/or otherwise grounded. The isolation plate 1110 can be configured to isolate the one or more surface mount attenuators 1114 (e.g., from other surface mount attenuators 1114). For example, the isolation plate can include one or more cavities 1112 configured to isolate a first surface mount attenuator 1114 from a second surface mount attenuator 1114. For example, the cavities can surround the first surface mount attenuator 1114 in a direction of a second surface mount attenuator 1114 and block cross-talk between attenuators 1114.

In some embodiments, the surface mount attenuator board 1100 (e.g., the flex circuit board 1102) can be or can include a surface mount attenuator board material, such as at ground layer(s) and/or signal line(s). The surface mount attenuator board material can be selected to provide high signal transfer performance characteristics. As examples, the surface mount attenuator board material can be or can include copper, brass, gold, and/or other suitable materials having high signal transfer performance characteristics. For instance, the surface mount attenuator board 1100 (e.g., the flex circuit board 1102) can include copper signal lines and/or ground layer(s) to provide high signal transfer performance characteristics.

Figure 12:
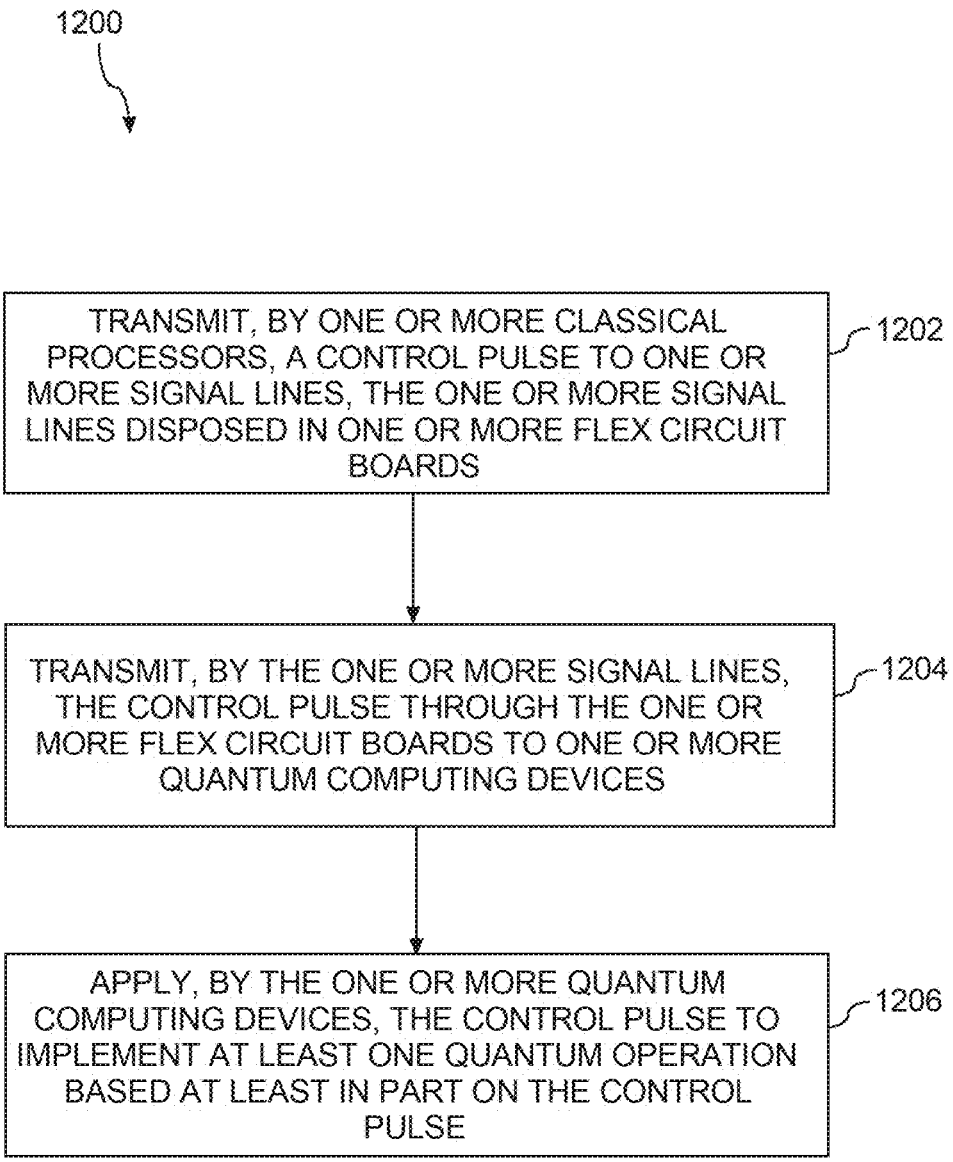
FIG. 12 depicts an example method of operating a quantum computing system including flex circuit boards according to example embodiments of the present disclosure.

FIG. 12 depicts an example method of operating a quantum computing system including flex circuit boards according to example embodiments of the present disclosure. The method 700 can be implemented using any suitable quantum computing system, such as any of the quantum computing systems 100 or 300 depicted in FIGS. 1-3. FIG. 12 depicts steps performed in a particular order for purposes of illustration and discussion. Those of ordinary skill in the art, using the disclosures provided herein, will understand that various steps of any of the methods disclosed herein can be adapted, modified, performed simultaneously, omitted, include steps not illustrated, rearranged, and/or expanded in various ways without deviating from the scope of the present disclosure.

The method 1200 can include, at 1202, transmitting a control pulse to one or more signal lines. For example, the control pulse can be transmitted by one or more classical processors coupled to the signal line(s). The control pulse can be or can include classical (e.g., binary) computer-readable signal data, such as a voltage signal, and/or signals that are implementable by quantum computing devices. The signal line(s) can be disposed in one or more flex circuit boards. For example, the flex circuit boards can be any suitable flex circuit boards discussed herein, such as flex circuit boards 400, 500, and/or 600 of FIGS. 4-6. The flex circuit boards may be disposed in any suitable quantum computing system, such as quantum computing systems 100 and/or 300 of FIGS. 1-3.

The method 1200 can include, at 1204, transmitting the control pulse through the one or more flex circuit boards to one or more quantum computing devices. For example, the control pulse can be transmitted through the signal line(s) in the one or more flex circuit boards to the quantum computing device(s). The control pulse can be transmitted, by the signal line(s), through a temperature gradient in a vacuum chamber. For instance, the signal line(s) carrying the control pulse can be progressively decreasing in temperature from the classical processor(s) (e.g., at room temperature and/or a temperature on the order of about 100 kelvin) to the quantum computing device(s) (e.g., at a temperature of less than about 1 kelvin, such as about 10 mK).

The method 1200 can include, at 1206, applying the control pulse to implement at least one quantum operation based at least in part on the control pulse. As one example, in some embodiments, the quantum operation(s) can be or can include obtaining state measurement(s) of the quantum computing device(s). For instance, the control pulse can instruct the quantum computing device(s) to measure the quantum state and/or resolve the quantum state to a basis state representation. Additionally, the measured quantum state can be transmitted (e.g., by the signal lines) to the classical processor(s).

As another example, in some embodiments, the quantum operation(s) can be or can include implementing at least one quantum gate operation by and/or at the quantum computing device(s). For instance, the control pulse can be descriptive of microwave pulses that are applied to the quantum computing device(s) (e.g., qubits) to perform quantum gating operations. Example quantum gating operations include, but are not limited to, Hadamard gates, controlled-NOT (CNOT) gates, controlled-phase gates, T gates, multi-qubit quantum gates, coupler quantum gates, etc.

Implementations of the digital and/or quantum subject matter and the digital functional operations and quantum operations described in this specification can be implemented in digital electronic circuitry, suitable quantum circuitry or, more generally, quantum computational systems, in tangibly-implemented digital and/or quantum computer software or firmware, in digital and/or quantum computer hardware, including the structures disclosed in this specification and their structural equivalents, or in combinations of one or more of them. The term "quantum computing systems" may include, but is not limited to, quantum computers/computing systems, quantum information processing systems, quantum cryptography systems, or quantum simulators.

Implementations of the digital and/or quantum subject matter described in this specification can be implemented as one or more digital and/or quantum computer programs, i.e., one or more modules of digital and/or quantum computer program instructions encoded on a tangible non-transitory storage medium for execution by, or to control the operation of, data processing apparatus. The digital and/or quantum computer storage medium can be a machine-readable storage device, a machine-readable storage substrate, a random or serial access memory device, one or more qubits/qubit structures, or a combination of one or more of them. Alternatively or in addition, the program instructions can be encoded on an artificially-generated propagated signal that is capable of encoding digital and/or quantum information (e.g., a machine-generated electrical, optical, or electromagnetic signal) that is generated to encode digital and/or quantum information for transmission to suitable receiver apparatus for execution by a data processing apparatus.

The terms quantum information and quantum data refer to information or data that is carried by, held, or stored in quantum systems, where the smallest non-trivial system is a qubit, i.e., a system that defines the unit of quantum information. It is understood that the term "qubit" encompasses all quantum systems that may be suitably approximated as a two-level system in the corresponding context. Such quantum systems may include multi-level systems, e.g., with two or more levels. By way of example, such systems can include atoms, electrons, photons, ions or superconducting qubits. In many implementations the computational basis states are identified with the ground and first excited states, however it is understood that other setups where the computational states are identified with higher level excited states (e.g., qudits) are possible.

The term "data processing apparatus" refers to digital and/or quantum data processing hardware and encompasses all kinds of apparatus, devices, and machines for processing digital and/or quantum data, including by way of example a programmable digital processor, a programmable quantum processor, a digital computer, a quantum computer, or multiple digital and quantum processors or computers, and combinations thereof. The apparatus can also be, or further include, special purpose logic circuitry, e.g., an FPGA (field programmable gate array), or an ASIC (application-specific integrated circuit), or a quantum simulator, i.e., a quantum data processing apparatus that is designed to simulate or produce information about a specific quantum system. In particular, a quantum simulator is a special purpose quantum computer that does not have the capability to perform universal quantum computation. The apparatus can optionally include, in addition to hardware, code that creates an execution environment for digital and/or quantum computer programs, e.g., code that constitutes processor firmware, a protocol stack, a database management system, an operating system, or a combination of one or more of them.

A digital computer program, which may also be referred to or described as a program, software, a software application, a module, a software module, a script, or code, can be written in any form of programming language, including compiled or interpreted languages, or declarative or procedural languages, and it can be deployed in any form, including as a stand-alone program or as a module, component, subroutine, or other unit suitable for use in a digital computing environment. A quantum computer program, which may also be referred to or described as a program, software, a software application, a module, a software module, a script, or code, can be written in any form of programming language, including compiled or interpreted languages, or declarative or procedural languages, and translated into a suitable quantum programming language, or can be written in a quantum programming language, e.g., QCL, Quipper, Cirq, etc.

A digital and/or quantum computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub-programs, or portions of code. A digital and/or quantum computer program can be deployed to be executed on one digital or one quantum computer or on multiple digital and/or quantum computers that are located at one site or distributed across multiple sites and interconnected by a digital and/or quantum data communication network. A quantum data communication network is understood to be a network that may transmit quantum data using quantum systems, e.g. qubits. Generally, a digital data communication network cannot transmit quantum data, however a quantum data communication network may transmit both quantum data and digital data.

The processes and logic flows described in this specification can be performed by one or more programmable digital and/or quantum computers, operating with one or more digital and/or quantum processors, as appropriate, executing one or more digital and/or quantum computer programs to perform functions by operating on input digital and quantum data and generating output. The processes and logic flows can also be performed by, and apparatus can also be implemented as, special purpose logic circuitry, e.g., an FPGA or an ASIC, or a quantum simulator, or by a combination of special purpose logic circuitry or quantum simulators and one or more programmed digital and/or quantum computers.

For a system of one or more digital and/or quantum computers or processors to be "configured to" or "operable to" perform particular operations or actions means that the system has installed on it software, firmware, hardware, or a combination of them that in operation cause the system to perform the operations or actions. For one or more digital and/or quantum computer programs to be configured to perform particular operations or actions means that the one or more programs include instructions that, when executed by digital and/or quantum data processing apparatus, cause the apparatus to perform the operations or actions. A quantum computer may receive instructions from a digital computer that, when executed by the quantum computing apparatus, cause the apparatus to perform the operations or actions.

Digital and/or quantum computers suitable for the execution of a digital and/or quantum computer program can be based on general or special purpose digital and/or quantum microprocessors or both, or any other kind of central digital and/or quantum processing unit. Generally, a central digital and/or quantum processing unit will receive instructions and digital and/or quantum data from a read-only memory, or a random access memory, or quantum systems suitable for transmitting quantum data, e.g. photons, or combinations thereof.

Some example elements of a digital and/or quantum computer are a central processing unit for performing or executing instructions and one or more memory devices for storing instructions and digital and/or quantum data. The central processing unit and the memory can be supplemented by, or incorporated in, special purpose logic circuitry or quantum simulators. Generally, a digital and/or quantum computer will also include, or be operatively coupled to receive digital and/or quantum data from or transfer digital and/or quantum data to, or both, one or more mass storage devices for storing digital and/or quantum data, e.g., magnetic, magneto-optical disks, or optical disks, or quantum systems suitable for storing quantum information. However, a digital and/or quantum computer need not have such devices.

Digital and/or quantum computer-readable media suitable for storing digital and/or quantum computer program instructions and digital and/or quantum data include all forms of non-volatile digital and/or quantum memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks; and quantum systems, e.g., trapped atoms or electrons. It is understood that quantum memories are devices that can store quantum data for a long time with high fidelity and efficiency, e.g., light-matter interfaces where light is used for transmission and matter for storing and preserving the quantum features of quantum data such as superposition or quantum coherence.

Control of the various systems described in this specification, or portions of them, can be implemented in a digital and/or quantum computer program product that includes instructions that are stored on one or more non-transitory machine-readable storage media, and that are executable on one or more digital and/or quantum processing devices. The systems described in this specification, or portions of them, can each be implemented as an apparatus, method, or electronic system that may include one or more digital and/or quantum processing devices and memory to store executable instructions to perform the operations described in this specification.

While this specification contains many specific implementation details, these should not be construed as limitations on the scope of what may be claimed, but rather as descriptions of features that may be specific to particular implementations. Certain features that are described in this specification in the context of separate implementations can also be implemented in combination in a single implementation. Conversely, various features that are described in the context of a single implementation can also be implemented in multiple implementations separately or in any suitable sub combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the implementations described above should not be understood as requiring such separation in all implementations, and it should be understood that the described program components and systems can generally be integrated together in a single software product or packaged into multiple software products.

Particular implementations of the subject matter have been described. Other implementations are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. A quantum computing system, comprising:
one or more classical processors;
quantum hardware comprising one or more qubits;
a chamber mount configured to support the quantum hardware;
a vacuum chamber configured to receive the chamber mount and dispose the quantum hardware in a vacuum, the vacuum chamber forming a cooling gradient from an end of the vacuum chamber to the quantum hardware; and
a plurality of flex circuit boards comprising one or more signal lines, each of the plurality of flex circuit boards configured to transmit signals by the one or more signal lines through the vacuum chamber to couple the one or more classical processors to the quantum hardware;
wherein the end of the vacuum chamber comprises a hermetic seal base comprising a plurality of fitted seals and a plurality of seal slots configured to receive the plurality of fitted seals, each of the plurality of flex circuit boards passing through a respective fitted seal of the hermetic seal base, and each of the plurality of fitted seals being inserted into a respective seal slot of the hermetic seal base.

2. The quantum computing system of claim 1, further comprising a classical-flex interconnect configured to couple the one or more classical processors to the plurality of flex circuit boards.

3. The quantum computing system of claim 2, wherein the classical-flex interconnect comprises a compression interposer.

4. The quantum computing system of claim 1, further comprising one or more flex-flex interconnects between the plurality of flex circuit boards.

5. The quantum computing system of claim 1, further comprising one or more surface mount attenuators coupled to the one or more signal lines.

6. The quantum computing system of claim 5, wherein the one or more surface mount attenuators comprise two or more surface mount attenuators, and further comprising an isolation plate configured to block cross-talk between the two or more surface mount attenuators.

7. The quantum computing system of claim 1, wherein each flex circuit board passes through the hermetic seal such that a first portion of each flex circuit board is disposed in the vacuum chamber and a second portion of each flex circuit board is disposed outside of the vacuum chamber.

8. The quantum computing system of claim 1, wherein the plurality of flex circuit boards comprises:
at least one ground layer; and
at least one dielectric layer disposed on an inner surface of the at least one ground layer;
wherein at least a portion of the one or more signal lines are disposed on an inner surface of the at least one dielectric layer.

9. The quantum computing system of claim 8, comprising:
two parallel and spaced apart ground layers; and
two dielectric layers each disposed on an inner surface of one of the ground layers;
wherein at least a portion of the one or more signal lines are disposed on an inner surface of the two dielectric layers.

10. The quantum computing system of claim 1, wherein the plurality of flex circuit boards comprises one or more vias.

11. The quantum computing system of claim 1, wherein the plurality of flex circuit boards comprises copper.

12. The quantum computing system of claim 1, wherein the plurality of flex circuit boards comprises a copper alloy.

13. The quantum computing system of claim 1, wherein the plurality of flex circuit boards comprises a superconducting material, the superconducting material exhibiting superconductivity at a temperature less than about 3 kelvin.

14. The quantum computing system of claim 13, wherein a ground layer of the flex circuit board comprises the superconducting material.

15. The quantum computing system of claim 13, wherein the one or more signal lines comprise the superconducting material.

16. The quantum computing system of claim 1, further comprising at least one filter configured to filter signals at the one or more signal lines.

17. The quantum computing system of claim 1, further comprising a connector coupling the plurality of flex circuit boards to the quantum hardware.

18. The quantum computing system of claim 17, wherein the connector comprises a T-joint connector.

19. A quantum computing system, comprising:
one or more classical processors;
quantum hardware comprising one or more qubits;
a chamber mount configured to support the quantum hardware;
a vacuum chamber configured to receive the chamber mount and dispose the quantum hardware in a vacuum, the vacuum chamber forming a cooling gradient from an end of the vacuum chamber to the quantum hardware;
at least one first flex circuit board coupled to the one or more classical processors by a classical-flex interconnect, the at least one first flex circuit board comprising copper;
at least one second flex circuit board coupled to the at least one first flex circuit board by a first flex-flex interconnect, the at least one second flex circuit board comprising a copper alloy;
at least one surface mount attenuator board comprising one or more surface mount attenuators coupled to the at least one second flex circuit board, the at least one surface mount attenuator board comprising copper;
at least one third flex circuit board coupled to the at least one surface mount attenuator board by a second flex-flex interconnect, the at least one third flex circuit board comprising niobium;
at least one fourth flex circuit board coupled to the at least one third flex circuit board by a third flex-flex interconnect, the at least one fourth flex circuit board comprising copper; and
a connector configured to couple the at least one fourth flex circuit board to the quantum hardware.

20. A quantum computing system, comprising:
one or more classical processors;
quantum hardware comprising one or more qubits;
a chamber mount configured to support the quantum hardware;
a vacuum chamber configured to receive the chamber mount and dispose the quantum hardware in a vacuum, the vacuum chamber forming a cooling gradient from an end of the vacuum chamber to the quantum hardware;
a plurality of flex circuit boards comprising one or more signal lines, each of the plurality of flex circuit boards configured to transmit signals by the one or more signal lines through the vacuum chamber to couple the one or more classical processors to the quantum hardware;
two or more surface mount attenuators coupled to the one or more signal lines; and
an isolation plate configured to block cross-talk between the two or more surface mount attenuators.

* * * * *